(12) United States Patent
Chen

(10) Patent No.: US 10,827,590 B2
(45) Date of Patent: *Nov. 3, 2020

(54) MICROCONTROLLER-BASED MULTIFUNCTIONAL ELECTRONIC SWITCH AND LIGHTING APPARATUS HAVING THE SAME

(71) Applicant: Vaxcel International Co., Ltd., Carol Stream, IL (US)

(72) Inventor: Chia-Teh Chen, Taipei (TW)

(73) Assignee: VAXCEL INTERNATIONAL CO., LTD., Carol Stream, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/693,794

(22) Filed: Nov. 25, 2019

(65) Prior Publication Data
US 2020/0092972 A1     Mar. 19, 2020

Related U.S. Application Data

(63) Continuation of application No. 16/402,586, filed on May 3, 2019, now Pat. No. 10,568,183, which is a
(Continued)

(30) Foreign Application Priority Data

Oct. 15, 2012 (TW) .............................. 101137918 A

(51) Int. Cl.
*H05B 37/02* (2006.01)
*H05B 47/105* (2020.01)
(Continued)

(52) U.S. Cl.
CPC ......... *H05B 47/105* (2020.01); *H03K 17/133* (2013.01); *H03K 17/56* (2013.01);
(Continued)

(58) Field of Classification Search
CPC ......... H05B 45/10; H05B 47/19; H05B 47/16
See application file for complete search history.

(56) References Cited

U.S. PATENT DOCUMENTS

| 4,322,637 A | 3/1982 | Takasago |
| 4,461,977 A | 7/1984 | Pierpoint |

(Continued)

*Primary Examiner* — Thuy Vinh Tran
(74) *Attorney, Agent, or Firm* — Li & Cai Intellectual Property (USA) Office

(57) ABSTRACT

A microcontroller based multifunctional electronic switch uses an external control device design for generating, detecting and converting an external control signal into a message carrying sensing signal interpretable and executable to a microcontroller. Based on a signal format of said message carrying sensing signal received said microcontroller operates to perform at least an on/off switch control mode, a dimming control mode and an illumination level switching control mode. When said signal format of said message carrying sensing signal detected is a short voltage signal, said microcontroller operates to perform said on/off control mode. When said signal format of said message carrying sensing signal detected is a long voltage signal said microcontroller operates to perform said dimming control mode. When said signal format of said message carrying sensing signal detected is a constant voltage signal, said microcontroller operates to perform said illumination level switching control mode.

75 Claims, 16 Drawing Sheets

Related U.S. Application Data continuation of application No. 15/702,871, filed on Sep. 13, 2017, now Pat. No. 10,334,698, which is a continuation of application No. 15/161,902, filed on May 23, 2016, now Pat. No. 9,795,007, which is a continuation of application No. 14/579,174, filed on Dec. 22, 2014, now Pat. No. 9,380,680, which is a continuation of application No. 13/792,002, filed on Mar. 9, 2013, now Pat. No. 8,947,000.

(51) Int. Cl.

| | | |
|---|---|---|
| *H03K 17/56* | (2006.01) | |
| *H03K 17/78* | (2006.01) | |
| *H03K 17/13* | (2006.01) | |
| *H03K 17/94* | (2006.01) | |
| *H05B 39/08* | (2006.01) | |
| *H05B 47/19* | (2020.01) | |
| *H05B 45/10* | (2020.01) | |
| *H05B 47/16* | (2020.01) | |
| *H05B 47/10* | (2020.01) | |

(52) U.S. Cl.
CPC ........... *H03K 17/78* (2013.01); *H03K 17/941* (2013.01); *H05B 39/08* (2013.01); *H05B 47/19* (2020.01); *H05B 45/10* (2020.01); *H05B 47/10* (2020.01); *H05B 47/16* (2020.01); *Y02B 20/40* (2013.01)

(56) References Cited

U.S. PATENT DOCUMENTS

| | | |
|---|---|---|
| 5,142,134 A | 8/1992 | Kunkel |
| 5,235,315 A | 8/1993 | Cherry et al. |
| 5,442,177 A | 8/1995 | Boulos et al. |
| 5,637,863 A | 6/1997 | Sanborn et al. |
| 5,946,209 A | 8/1999 | Eckel et al. |
| 6,285,140 B1 | 9/2001 | Ruxton |
| 6,294,873 B1 | 9/2001 | Yu |
| 7,005,806 B2 | 2/2006 | Shih |
| 7,417,378 B2 | 8/2008 | Kim |
| 7,566,859 B2 | 7/2009 | Shih |
| 8,035,513 B2 | 10/2011 | Raper |
| 8,310,163 B2 | 11/2012 | Chen |
| 8,598,805 B2 | 12/2013 | Tremblay et al. |
| 8,735,826 B2 | 5/2014 | Lee et al. |
| 9,035,568 B2 | 5/2015 | Ganton et al. |
| 9,743,480 B2 | 8/2017 | Chen |
| 9,826,590 B2 | 11/2017 | Chen |
| 10,165,643 B2 | 12/2018 | Chen |
| 2006/0261741 A1 | 11/2006 | Hwang |
| 2011/0080111 A1* | 4/2011 | Nuhfer .................. H05B 45/10 315/291 |
| 2012/0068686 A1* | 3/2012 | Steiner .................. H05B 47/19 323/318 |
| 2012/0286676 A1* | 11/2012 | Saveri, III ............ H05B 47/19 315/159 |
| 2013/0049610 A1 | 2/2013 | Chen |
| 2013/0257315 A1 | 10/2013 | Restrepe et al. |
| 2014/0159877 A1 | 6/2014 | Huang |

* cited by examiner

| Brand | $V_F$ Min. | $V_F$ Max. | Product Series | Information Source |
|---|---|---|---|---|
| CREE | 2.9V | 3.3V | J Series LEDs/J Series 2835 | www.cree.com/led-components/products/j2835/jseries-2835 |
| LUMILEDS | 2.7V | 3.3V | LUXEON 2835 Line | www.lumileds.com/luxeon2835line |
| SAMSUNG | 2.9V | 3.3V | KM281BA+ | www.samsung.com/app/components/products/j2835/jseries-2835 |
| OSRAM | 2.7V | 3.3V | DURIS® E/DURISR E 2835 | www.osram.com/app/product_selector/#!?query=DORIS%20E%202835&sortField=&sortOrder=&start-0&filters=productbrand,DORIS,E&filters-productbrand,DORIS |

FIG. 12

MICROCONTROLLER-BASED MULTIFUNCTIONAL ELECTRONIC SWITCH AND LIGHTING APPARATUS HAVING THE SAME

CROSS-REFERENCE TO RELATED APPLICATIONS

This Application is a continuation application of prior application Ser. No. 16/402,586 filed on May 3, 2019, issued as U.S. Pat. No. 10,568,183 on Feb. 18, 2020, and the entire contents of which are incorporated herein by reference. The prior application Ser. No. 16/402,586 filed on May 3, 2019, issued as U.S. Pat. No. 10,568,183 on Feb. 18, 2020 is a continuation application of prior application Ser. No. 15/702,871 filed on Sep. 13, 2017, now U.S. Pat. No. 10,334,698, issued on Jun. 25, 2019. The prior application Ser. No. 15/702,871 filed on Sep. 13, 2017, issued as U.S. Pat. No. 10,334,698 on Jun. 25, 2019, is a continuation application of prior application Ser. No. 15/161,902 filed on May 23, 2016, now U.S. Pat. No. 9,795,007 issued on Oct. 17, 2017. The prior application Ser. No. 15/161,902 filed on May 23, 2016, issued as U.S. Pat. No. 9,795,007 on Oct. 17, 2017, is a continuation application of prior application Ser. No. 14/579,174 filed on Dec. 22, 2014, now U.S. Pat. No. 9,380,680, issued on Jun. 28, 2016, the prior application Ser. No. 14/579,174 filed on Dec. 22, 2014 is a continuation application of U.S. Pat. No. 8,947,000, issued on Feb. 3, 2015.

BACKGROUND

1. Technical Field

The present disclosure relates to a technology using a microcontroller with program codes designed to provide a user friendly solution for performing on/off switch control, diming control, and timer management for a lighting apparatus or an electrical appliance.

2. Description of Related Art

A mechanical-type electric switch is a manually operated electromechanical device. Its function is based on attaching or detaching two metal conductors to produce a short or open circuit, respectively. This mechanical-type switch is not suitable for installing in a space where has the concern of gas explosion, because an instantaneous surge current, produced by suddenly engaging or releasing the metallic contact of the switch, may generate electric sparks to ignite fire.

A controllable semiconductor switching element, such as a triac, has nearly zero voltage between two output-electrodes in conduction mode and nearly zero current through two output-electrodes in cut-off mode. Solid state electronic switch utilizing the above unique features of triac for circuit on/off switch control can avoid generating electric arc, since the main current pathway of the solid-state switch is not formed by engaging the two metal conductors. It becomes a much better choice than mechanical-type electric switch from the stand point of safety consideration.

Solid-state electronic switches are constructed with various methods to trigger controllable switching element, like triac or thyristor, into conduction or cutoff for desired electric power transmission. For example, U.S. Pat. No. 4,322,637 disclosed a technique using optical coupling element to control bi-directional thyristor or triac in conduction or off state; or another U.S. Pat. No. 6,285,140B1 disclosed a technique using microcontroller incorporated with zero-crossing-point detector to generate AC-synchronized time-delay pulse to control triac in on or cut-off state so as to transmit variable electric power to a light-emitting diode load.

Mostly a mechanical toggle or spring button of similar setup is usually applied on the electronic switch to facilitate manual on/off switch operation. The operation of electronic switch with mechanical toggle means an inevitable contact by hand which is not appropriate in working places such as kitchens or hospitals. To relieve concerns of contagion or contamination resulted through hand contacts, touchless switches are developed. For example, U.S. Pat. No. 5,637,863 disclosed a technique utilized infrared sensor to activate electronic switch to operate on/off switch control, and even dimming control presumably by modifying its circuit design.

In retrospect, the above mentioned prior arts have however still some drawbacks. For instance, U.S. Pat. No. 5,637,863 used a complicated infrared sensor construction and circuit design; or U.S. Pat. No. 6,285,140B1 did not resort to an efficient control of electric power transmission from power source to various electric impedances which is required in lighting apparatus.

SUMMARY

An exemplary embodiment of the present disclosure provides a multifunctional electronic switch which utilizes a microcontroller to perform at least two functions, which are on/off switch control and dimming control or power transmission level control, for a lighting apparatus or an electric appliance. The multifunctional electronic switch comprises a microcontroller, a detection means and a controllable semiconductor switching element. The controllable semiconductor switching element is connected between a load and a power source in a serial fashion. The detection means detects an external control signal and converts the outcome into message carrying low voltage sensing signals readable to the microcontroller. The microcontroller operates according to specific format of the sensing signals the controllable semiconductor switching element in on/off switch mode or in dimming control mode so as to transmit whole/zero electric power, or to transmit dimmed electric power, from the power source to the load.

An exemplary embodiment of the present disclosure provides a microcontroller based electronic switch for detecting an external control signal. The microcontroller based electronic switch comprises a detection means, a microcontroller, and a controllable switching element. The controllable switching element is electrically connected between a power source and a load. The detection means is used for detecting the external control signal played by the user and converting the external control signal into a message carrying sensing signal. The microcontroller with program codes written and designed to read and interpret the message carrying sensing signal generated by the detection means, wherein the microcontroller is electrically connected between the controllable switching element and the detection means. The microcontroller controls the conduction state or cutoff state of the controllable switching element according to the message carrying sensing signal generated by the detection means. When the controllable switching element is in a conduction state, the microcontroller further controls electric power transmission level from the power source to the load according to the time length of the message carrying sensing signal received from the detection means.

An exemplary embodiment of the present disclosure provides a microcontroller based electronic switch connected between a load and a DC power source. The microcontroller based electronic switch controls the conduction rate between the load and the DC power source. The microcontroller based electronic switch comprises a detection means, a microcontroller, and an uni-directional controllable semiconductor switching element. The uni-directional controllable semiconductor switching element is connected between the load and the DC power source. The detection means is used for detecting the external control signal played by the user and converting said external control signal into a message carrying sensing signal. The microcontroller is connected between the uni-directional controllable semiconductor switching element and the detection means. The microcontroller produces a pulse-width-modulation voltage signal according to the message carrying sensing signal, so as to control a conduction or cut-off state of the uni-directional controllable semiconductor switching element. When the uni-directional controllable semiconductor switching element is in conduction state, the microcontroller controls electric power transmission level according to the message carrying sensing signal, wherein the electric power is supplied to the load from the DC power source.

An exemplary embodiment of the present disclosure provides a microcontroller based electronic switch connected between a load and an AC power source. The microcontroller based electronic switch controls the conduction rate between the load and the AC power source. The microcontroller based electronic switch comprises a detection means, a microcontroller, a zero-crossing-point detector and a bi-directional controllable semiconductor switching element. The bi-directional controllable semiconductor switching element is connected between the load and the AC power source. The detection means is used for detecting the external control signal played by the user and converting said external control signal into a message carrying sensing signal. The zero-crossing-point detector is connected between the microcontroller and the AC power source. The microcontroller is connected, respectively, to the detection means, the zero-crossing-point detector, and the bi-directional controllable semiconductor switching element. The microcontroller generates zero-crossing-point time-delay pulse or zero voltage, respectively, to control the conduction or cut-off state of the bi-directional controllable semiconductor switching element according to the message carrying sensing signal. When the bi-directional controllable semiconductor switching element is in conduction state, the microcontroller controls electric power transmission level according to the time length of the message carrying sensing signal, wherein the electric power is supplied to the load from the AC power source.

To sum up, the present disclosure is characteristic in, a touchless or a direct touch interface between the user and the multifunctional electronic switch is created to implement at least two operation modes of the electronic switch by using software codes written in OTPROM (one-time programmable read only memory) of microcontroller to analyze the message carrying sensing signals.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

FIG. 12 is a data sheet showing data of the minimum forward voltages and maximum forward voltages collected from various LED manufacturers.

DESCRIPTION OF THE EXEMPLARY EMBODIMENTS

Figure 1:
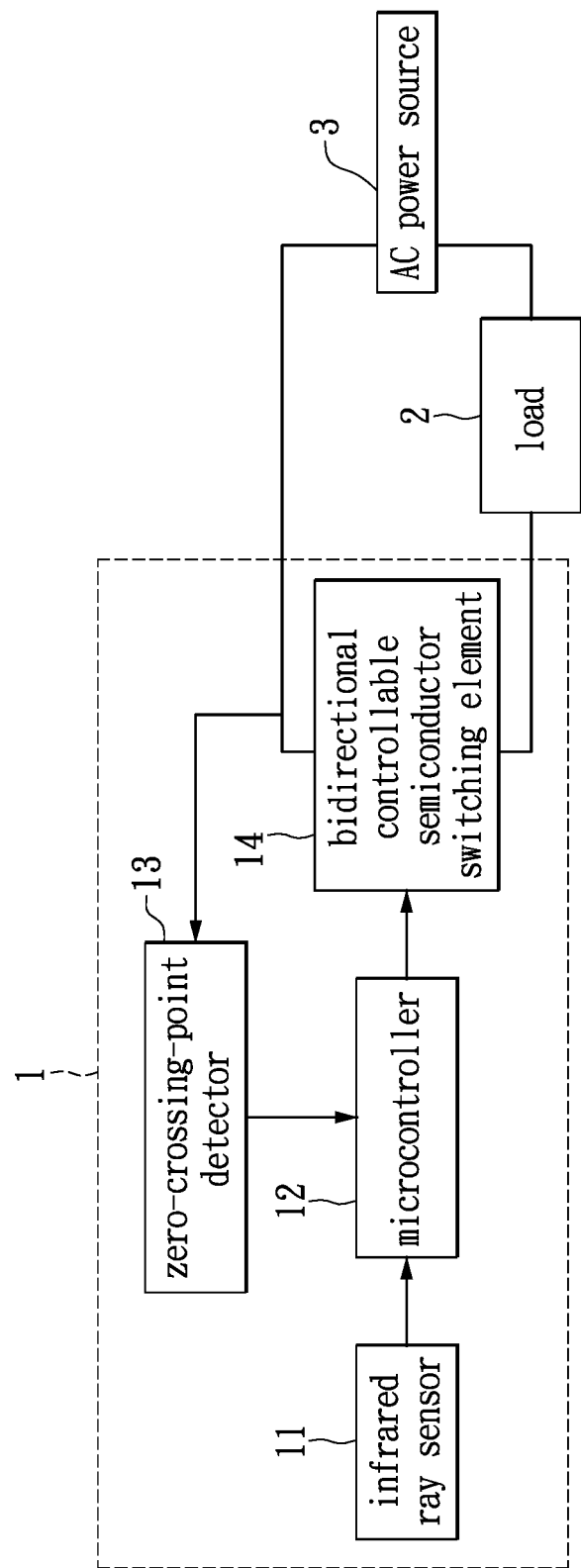
FIG. 1 is a block diagram of a microcontroller based electronic switch using an infrared ray sensor as a detection means applied for an AC power source according to an exemplary embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

Referring to FIG. 1, FIG. 1 is a block diagram of a microcontroller based electronic switch using an infrared ray sensor as a detection means applied for an AC power source according to an exemplary embodiment of the present disclosure. A microcontroller based electronic switch 1 is connected in series to an AC power source 3, and is further connected to a load 2, so as to control AC power delivered to the load 2. The microcontroller based electronic switch 1 comprises at least an infrared ray sensor 11, a microcontroller 12, a zero-crossing-point detector 13, and a bi-directional controllable semiconductor switching element 14. The infrared ray sensor 11 is connected to one pin of microcontroller 12 to transmit a low voltage sensing signal to the microcontroller 12. The zero-crossing-point detector 13 is connected to another pin of microcontroller 12 and is also electrically coupled to the AC power source 3 to produce AC power synchronized signals which are fed to the microcontroller 12. The microcontroller 12 through its one designated pin is electrically connected to the control electrode of the bi-directional controllable semiconductor switching element 14 so as using appropriate conduction phase to control the electrical conduction state of the bi-directional controllable semiconductor switching element 14.

The infrared ray sensor 11 detects object motions coming from the user and converts the detected result into message carrying low voltage sensing signals readable to the microcontroller 12. The microcontroller 12 decodes the low voltage sensing signals (message carrying low voltage sensing signals) according to the program designed and written in its OTPROM (one-time programmable read only memory) memory. The microcontroller 12 is with program codes written and designed to read and interpret the message carrying sensing signal generated by the infrared ray sensor 11. The infrared ray sensor 11 is an exemplary embodiment for a detection means to detect the external motion signal played by the user and convert the external motion signal into a message carrying sensing signal. The microcontroller 12 recognizes the working mode that the user has chosen and proceeds to execute the corresponding loop of subroutine for performance. Each working mode is defined in the software codes with loops of subroutine for execution.

One working mode is on/off switch control mode. In this working mode, according to the low voltage sensing signal from the infrared ray sensor 11, the microcontroller 12 operates the bi-directional controllable semiconductor switching element 14 in conduction state or cut-off state alternatively. More specifically, in this working mode, together with the zero-crossing-point detector 13, the microcontroller 12 generates voltage pulses synchronized with the AC power source 3 to trigger the bi-directional controllable semiconductor switching element 14 to be in conduction state, such that a fixed electric power can be sent to the load 2; or the microcontroller 12 generates a zero voltage to set the bi-directional controllable semiconductor switching element 14 to be in cut-off state, and thereby ceases to transmit the fixed electric power to the load 2.

Another working mode is dimming control mode about controlling different levels of electric power transmission to the load 2 by controlling the conduction rate of the bi-directional controllable semiconductor switching element 14. Using the synchronized signals produced by the zero-crossing-point detector 13 as a reference, the microcontroller 12 generates phase delay voltage pulses synchronized with the AC power source 3 to trigger the conduction of the bi-directional controllable semiconductor switching element 14 to transmit electric power to the load 2. Responding to the low voltage sensing signals from the infrared ray sensor 11, the microcontroller 12 continuously changes the phase delay time of the triggering pulses during each cycle period of the AC power source 3. Consequently, the conduction rate of the bi-directional controllable semiconductor switching element 14 is gradually changed. The power level of the load 2 is therefore managed by the low voltage sensing signals from the infrared ray sensor 11 which are generated according to the user's intention, wherein when the bi-controllable semiconductor switching element 14 is in conduction state, the microcontroller further controls the electric power transmission level from the AC power source 3 to the load 2 according to low voltage sensing signals from the infrared ray sensor 11.

Figure 2:
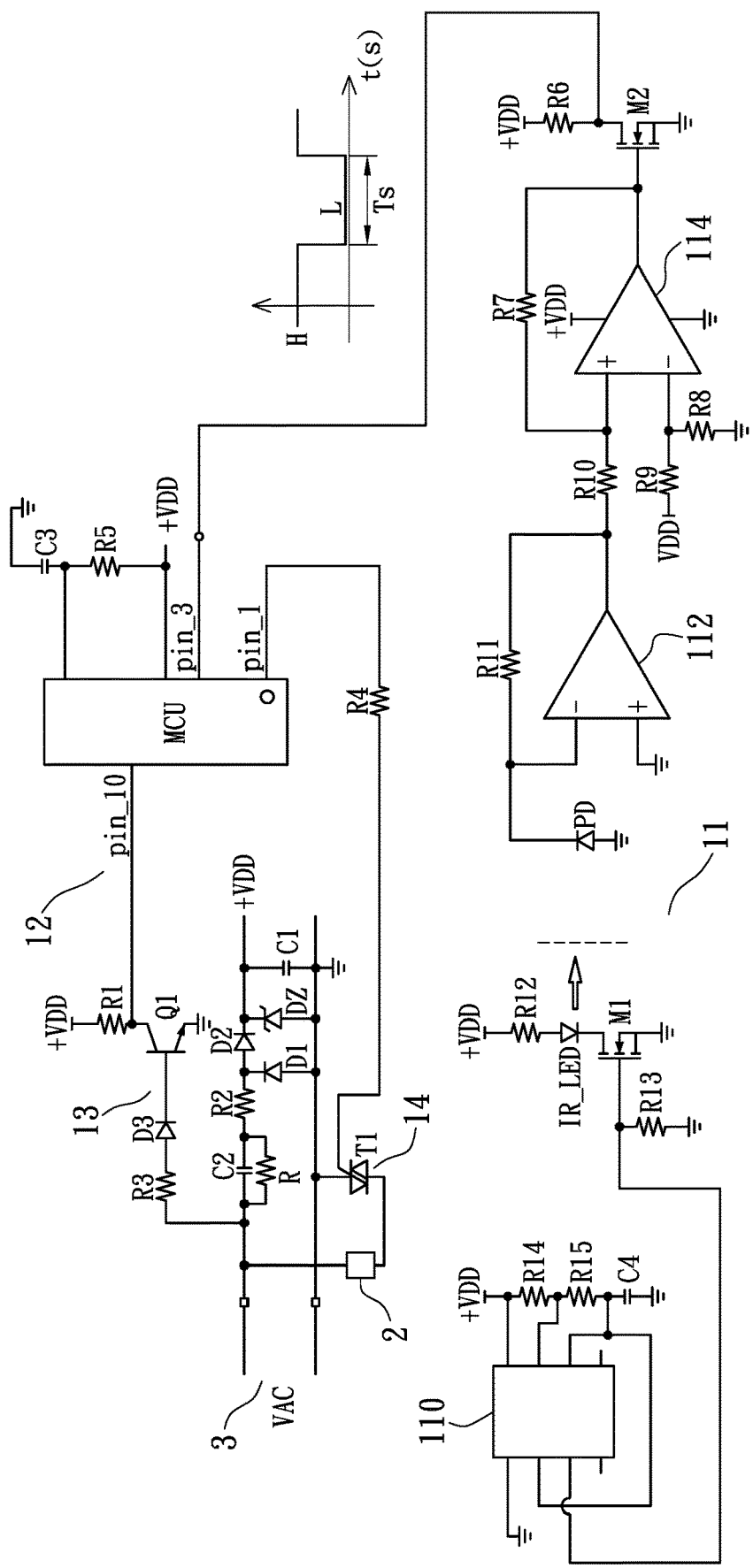
FIG. 2 is a circuit diagram of a microcontroller based electronic switch using an infrared ray sensor applied for an AC power source according to an exemplary embodiment of the present disclosure.

Referring to FIG. 1 and FIG. 2, FIG. 2 is a circuit diagram of a microcontroller based electronic switch applied for an AC power source according to an exemplary embodiment of the present disclosure. The microcontroller based electronic switch 1 is connected through a bi-directional controllable semiconductor switching element 14 to the AC power source 3 and the load 2 in a serial fashion. A voltage VDD for the circuit system is generated by conventional voltage reduction and rectification from the AC power 3. The output stage of the infrared ray sensor 11 is a transistor M2. The drain of the transistor M2 is connected to a pin pin_3 of the microcontroller 12 to deliver low voltage sensing signals to the microcontroller 12.

The zero-crossing-point detector 13 is composed of a transistor Q1 and a diode D3. The collector of the transistor Q1 is connected to a pin pin_10 of the microcontroller 12, the base of the transistor Q1 is connected to a conducting wire of the AC power source 3 through the diode D3 and a resistor R3. In the positive half-cycle for AC power source 3, the transistor Q1 is saturated conducting, and the voltage at the collector of the transistor Q1 is close to zero. In the negative half-cycle for AC power source 3, the transistor Q1 is cut-off, and the voltage at the collector of the transistor Q1 is a high voltage of VDD. Corresponding to the sine wave of the AC power source 3, the zero-crossing-point detector 13 generates therefore signals of square wave alternatively with a low voltage and a high voltage through the collector of the transistor Q1. The square wave is synchronized with the AC power source 3 and sent to a pin pin_10 of the microcontroller 12 for the purpose of controlling conduction phase, and the details thereof are described later. In practice, the bi-directional controllable semiconductor switching element 14 can be a triac T1, the pin pin_1 of the microcontroller 12 is connected to the gate of the triac T1 to control the conduction or cut-off state of the triac T1, or to control the conduction rate of the triac T1.

Still referring to FIG. 2, the infrared ray sensor 11 comprises a transmitting circuit and a receiving circuit. In the transmitting circuit, an infrared light-emitting diode IR_LED is connected to the drain of the transistor M1 in a serial fashion, and the gate of the transistor M1 is connected to an output of the timer 110. In practice, the timer 110 can be a 555 timer IC. The 555 timer IC generates a square-wave with a frequency of about 3 kHz to modulate the drain current of the transistor M1, such that the infrared light-emitting diode IR_LED provides an infrared light signal with a square wave form which is severed as the light source of the infrared ray sensor.

The receiving circuit is an infrared light detection circuit and comprises a photosensitive diode PD, two serially connected amplifiers 112, 114, and a transistor M2. The drain of the transistor M2 is connected to a pin pin_3 of the microcontroller 12. In practice, the amplifiers 112 and 114 can be LM324 operational amplifier. The combination of the amplifier 114 and resistors R7 through R10 is a Schmitt trigger circuit having a threshold voltage, and the threshold voltage is produced by the voltage divider composed by resistors R8 and R9. The Schmitt trigger circuit makes possible a high discrimination of a true detection to a false one.

The photosensitive diode PD is used to receive the infrared light signal from the transmitting circuit. If the output voltage of the amplifier 112 exceeds the threshold voltage, the amplifier 114 produces a high voltage applied to the gate of the transistor M2, such that the transistor M2 is turned on. Therefore, the drain of the transistor M2 provides a low voltage sensing signal which is close to zero voltage, and the time length of the low voltage sensing signal is related to the time period the infrared ray is detected.

In addition, if the photosensitive diode PD does not receive the infrared light signal, the output voltage of the amplifier 112 is lower than the threshold voltage, and then the amplifier 114 provides a low voltage to the gate of the transistor M2, such that the transistor M2 is turned off. Therefore, the drain of the transistor M2 provides a high voltage of VDD. In other words, the pin pin_3 of the microcontroller 12 receives either a low voltage sensing signal or a high voltage depending on whether the infrared ray sensor 11 detects the infrared light or not, wherein the time length of the low voltage sensing signal is about the time period within which the infrared light is detected.

Figure 3B:
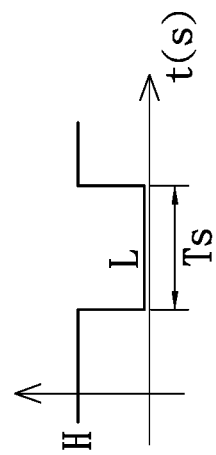
FIG. 3B is a waveform diagram showing a low voltage sensing signal according to an exemplary embodiment of the present disclosure.
Figure 3A:
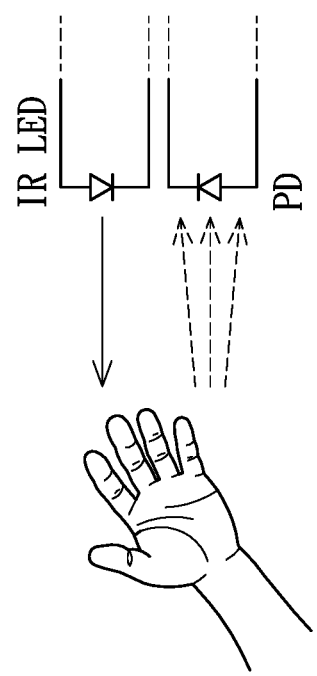
FIG. 3A is a schematic diagram showing a practical operation of an infrared ray sensor associated with a microcontroller based electronic switch according to an exemplary embodiment of the present disclosure.

In other words, the infrared ray sensor 11 generates a sensing signal which is characterized by a low voltage within a time length. The sensing signal with a specific time length of low voltage can be considered as a sensing signal format which carries message to make the microcontroller 12 to operate in one of at least two working modes accordingly, wherein one working mode is on/off switch control mode and the another one is dimming control mode to control the conduction rate of the bi-directional controllable semiconductor switching element 14. Referring to FIG. 2, FIG. 3A and FIG. 3B, FIG. 3A is a schematic diagram showing a practical operation of an infrared ray sensor associated with a microcontroller based electronic switch according to an exemplary embodiment of the present disclosure, and FIG. 3B is a waveform diagram showing a low voltage sensing signal according to an exemplary embodiment of the present disclosure. In FIG. 3A, the infrared light-emitting diode IR_LED is parallel arranged to the photosensitive diode PD without accurate alignment. When an object, here is a human hand, moves in front of the infrared light-emitting diode IR_LED, the infrared light emitted from the infrared light-emitting diode IR_LED scatters from the object surface onto the photo sensing surface of the photosensitive diode PD.

FIG. 3B shows a waveform of the low voltage sensing signal provided from the infrared ray sensor 11. If the photosensitive diode PD does not receive the infrared light scattered from the target object surface, or the intensity of the infrared light received by the photosensitive diode PD is insufficient, the drain of the transistor M2 provides a high voltage H of VDD. Within an appropriate distance, the photosensitive diode PD receives the infrared light scattered from the object surface, and the intensity of the received infrared light is enough to cause the output voltage of the amplifier 112 exceeding the threshold voltage, the amplifier 114 produces a high voltage, such that the transistor M2 is turned on, and the drain of the transistor M2 provides a signal with a low voltage L of about zero volt. In other words, when the infrared ray sensor 11 detects an object, most commonly user's hand, purposefully entering the infrared ray detecting zone, the infrared ray sensor 11 generates a low voltage sensing signal, by contrast when an object is not within the infrared ray detecting zone, the infrared ray sensor 11 generates a high voltage. The infrared ray sensor 11 comprising a means for emitting infrared light to form the defined infrared ray detecting zone, a means for detecting infrared light reflected from the object moving into the infrared ray detecting zone.

The appropriate distance or the infrared ray detecting zone is defined as an effective sensing range or area of the infrared ray sensor 11. In FIG. 3B, the time length Ts of the low voltage L is approximately equal to the time period that an object stays within the infrared ray detecting zone, wherein the time period is about a few tenths through a few seconds. When the object leaves the infrared ray detecting zone, the signal delivered from the infrared ray sensor 11 changes from a low voltage L to a high voltage H, as shown in FIG. 3B. Hence the sensing signal generated from the infrared ray sensor 11 is a binary signal readable to the program written in the OTPROM memory of the microcontroller 12. The microcontroller based electronic switch 1 utilizes specific sensing signal format characterized by the time length Ts of the low voltage sensing signal to implement at least two functions, namely, on/off switch control and dimming control. By introducing a preset time To, the microcontroller 12 can execute subroutine corresponding to the functions of the on/off switch control and the dimming control determined by a comparison scheme of the time length Ts with the preset time To. The user can therefore operates the microcontroller-based electronic switch 1 in a convenient manner simply by moving his hand into or out of the infrared ray detecting zone of the infrared ray sensor 11, and staying his hand there for a time period to select desired performance function.

Figure 4:
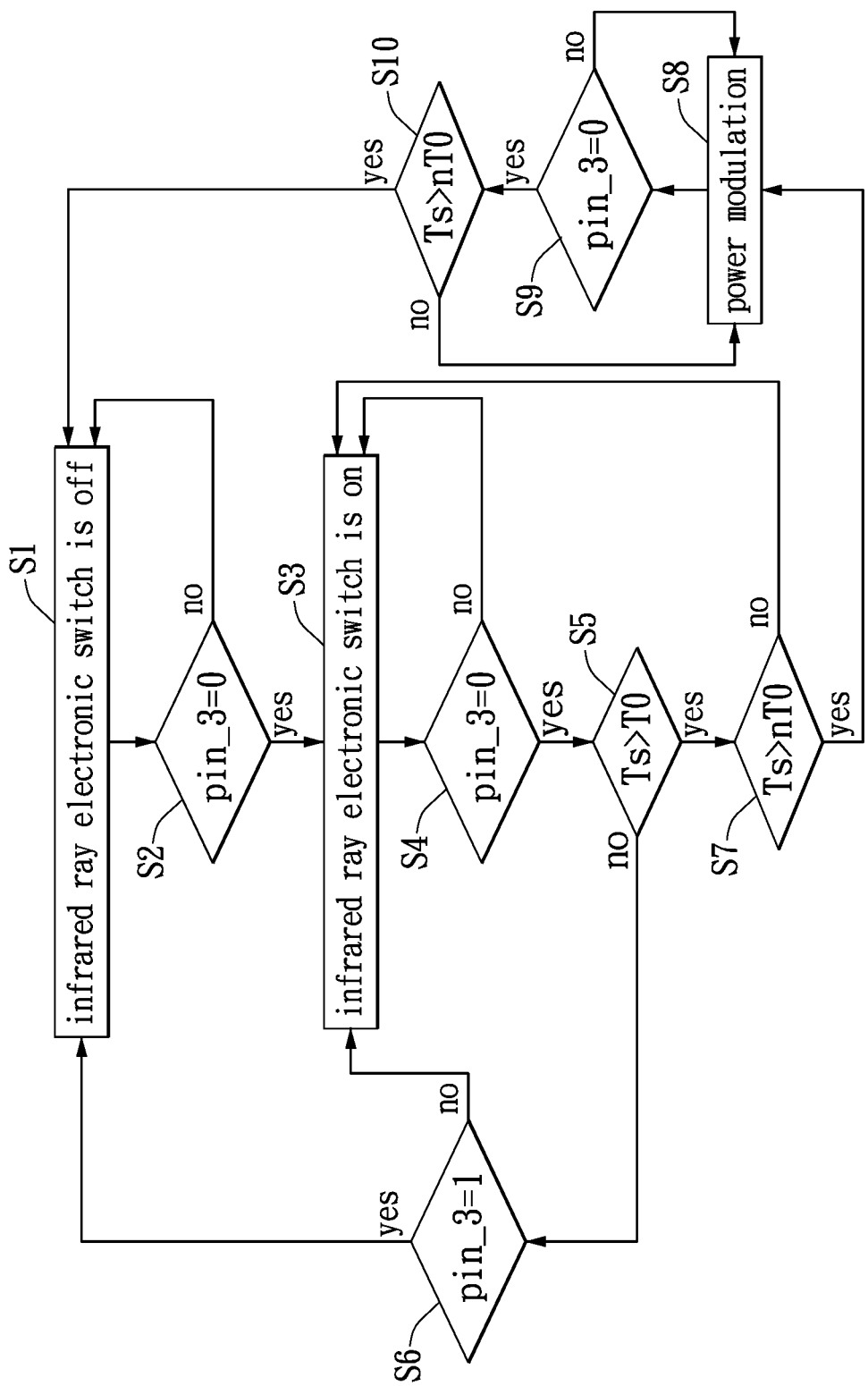
FIG. 4 is a flow chart of a program executed in a microcontroller based electronic switch according to an exemplary embodiment of the present disclosure.

Referring to FIG. 2, FIG. 3 and FIG. 4, FIG. 4 is a flow chart of a program executed in a microcontroller of a microcontroller based electronic switch according to an exemplary embodiment of the present disclosure. The program written in the OTPROM memory of the microcontroller 12 includes several subroutine loops. These loops are started from the loop of steps S1 through S6 of the on/off switch control mode, and may jump into the loop of steps S8 through S10 of the dimming control mode according to the time length Ts of the low voltage sensing signal. The pin pin_3 of the microcontroller 12 receives a high voltage H or a low voltage L from the infrared ray sensor 11, wherein the time length Ts of the low voltage sensing signal is about the time length which the user's hand stays within the infrared ray detecting zone.

The program of the microcontroller 12 starts its execution from the loop of steps S1 and S2 in which the microcontroller based electronic switch 1 is off. The program of the microcontroller 12 scans the voltage at the pin pin_3 of the microcontroller 12. If the voltage at the pin pin_3 of the microcontroller 12 is high (bit 1), the program of the microcontroller 12 stays in the loop of steps S1 and S2 that the microcontroller based electronic switch 1 is off. On the contrary, if the voltage at the pin pin_3 is low (bit 0), the program of the microcontroller 12 jumps into the loop of steps S3 through S6 in which the microcontroller based electronic switch 1 is on. At step S4 when the microcontroller based electronic switch 1 is on, the program of the microcontroller 12 scans the voltage at the pin pin_3 of the microcontroller 12. If the voltage at the pin pin_3 of the microcontroller 12 is low (bit 0), the program of the microcontroller 12 jumps to step S5 to compare the time length Ts with a preset time To. In practice, the preset time To is between 1 through 3 seconds, but the present disclosure is not limited thereto.

At step S5, the program of the microcontroller 12 check the time length Ts, if Ts is shorter than the preset time To, step S5 proceeds to step S6 to detect whether the voltage at the pin pin_3 is momentary a high voltage H (bit 1). At step S6, if the voltage at the pin pin_3 is the voltage H, the program goes back to the loop of steps S1 and S2 in which the microcontroller based electronic switch 1 is off. At step S6, if the voltage at the pin pin_3 is low, the program remains in the loop of steps S3 through S6 in which the microcontroller based electronic switch 1 is on.

To sum up, the on/off switch control mode is described by the loops consisting of steps S1 through S6 that the microcontroller based electronic switch 1 is operated in off- and on-state rotationally. The microcontroller based electronic switch 1 is on or off according to whether the user moves his hand into and then pulls out the infrared ray detecting zone of the infrared ray sensor 11 within the preset time To.

At step S5, the program of the microcontroller 12 check the time length Ts, if the time length Ts is longer than the preset time To, the program jumps to step S7 to detect whether the time length Ts is longer than n times the preset time To (n≥2). At step S7, if the time length Ts is not longer than n times the preset time To, the program goes back to the loop of steps S3 through S6 that the microcontroller based electronic switch 1 remains on. At step S7, if the time length Ts is longer than n times the preset time To, the program jumps into a loop consisting of steps S8 through S10 to execute a subroutine for the dimming control mode of microcontroller based electronic switch 1. FIG. 4 does not show the details of subroutine associated with the dimming control mode, but the process is described in short as follows. At step 9, the program of the microcontroller 12 scans the voltage at the pin pin_3 of the microcontroller 12. The program proceeds to step 10 from Step 9, if the voltage at the pin pin_3 is low. At step 10, the subroutine of the microcontroller 12 checks if Ts>nTo. If the voltage at the pin pin_3 is low for several times, and the time lengths denoted by Ts or Ts' are shorter than n times the preset time To, the subroutine remains in the rotation loop defined by step 8 through S10, and microcontroller 12 continuously increases or decreases the electric power transmission to the load 2 by controlling the conduction rate. If the electric power of the load 2 reaches the maximum or minimum electric power, the program of the microcontroller 12 responds no more to the low voltage sensing signal. At step 10, if the time length Ts is longer than n times the preset time To, the program of the microcontroller 12 jumps back to the loop of steps S1 and S2 in which the microcontroller based electronic switch 1 is off. Then, the program of the microcontroller 12 resumes itself from steps S1 and S2 in a rotational manner to execute the subroutines represented by the steps shown in FIG. 4.

In the exemplary embodiment of FIG. 2, the preset time To and the number n can be set 2 seconds and 2, respectively. Referring to the steps executed by the microcontroller 12 in FIG. 4, if the detected time length Ts of the low voltage sensing signal at the pin pin_3 is less than 2 seconds, that means the time period which the hand stays within the infrared ray detecting zone is less than 2 seconds, the microcontroller 12 remains in the current function mode. If the detected time length Ts at the pin pin_3 is longer than 4 seconds, that means the time length which the hand stays within the infrared ray detecting zone is longer than 4 seconds, the microcontroller 12 changes the current function mode to another one function mode. In other words, if the time length Ts of the low voltage sensing signal is shorter than the preset time To, the microcontroller 12 operates either in on/off switch mode or in dimming mode. If the detected time length Ts of the low voltage sensing signal is longer than n times the preset time To, the microcontroller 12 changes its program execution from the on/off switch mode into the dimming control mode and vice versa.

In addition, the concept of the present disclosure can be further extended to implement a multifunctional electronic switch having at least three functions built in one, which are on/off switch control, dimming control and timer management. The program written in the OTPROM memory of the microcontroller can be modified in such a manner that the microcontroller responds not only to the low voltage sensing signal of the infrared ray sensor, but also to a specific sequence of the sensing signals. The microcontroller executes subroutines of working modes corresponding to the said three functions according to the detected time length Ts and special sequence of the low voltage sensing signals. The first working mode is on/off switch control mode used to control the conduction or cut-off state of the controllable semiconductor switching element. The second working mode is dimming control mode used to control the conduction rate of the controllable semiconductor switching element. The third working mode is timer management mode used to momentarily delay and gradually turn off the controllable semiconductor switching element. When the infrared ray sensor generates a low voltage sensing signal within the preset time To, the microcontroller operates in the on/off switch mode by controlling the conduction or cut-off state of the controllable semiconductor switching element alternately. If the time length Ts of the low voltage sensing signal is longer than n times the preset time To, the microcontroller changes its operation from the on/off switch control mode to the dimming control mode. Once in the dimming control mode, the microcontroller executes subroutine to gradually change the conduction rate of the controllable semiconductor switching element from the maximum conduction rate to the minimum conduction rate, and then to gradually change the conduction rate from the minimum conduction rate to the maximum conduction rate for completing a dimming cycle. In the dimming cycle, the moment when the infrared ray sensor provides a high voltage is a dimming end point. According to the dimming control mode design, the microcontroller locks the conduction rate of the controllable semiconductor switching element at the dimming end point. Thereafter, if the infrared ray sensor generates a plurality of low voltage sensing signals, for instance, a plural signal of two consecutive sensing signals, each within the preset time To, the microcontroller operates in the timer management mode by executing a subroutine to momentarily delay and gradually to turn off the controllable semiconductor switching element. It is clear to see the advantage of the present disclosure to integrate various switch control functions in one without changing the hardware circuit design. All are simply done by defining the format of sensing signals and by modifying the program written in the OTPROM memory in the microcontroller.

Figure 5:
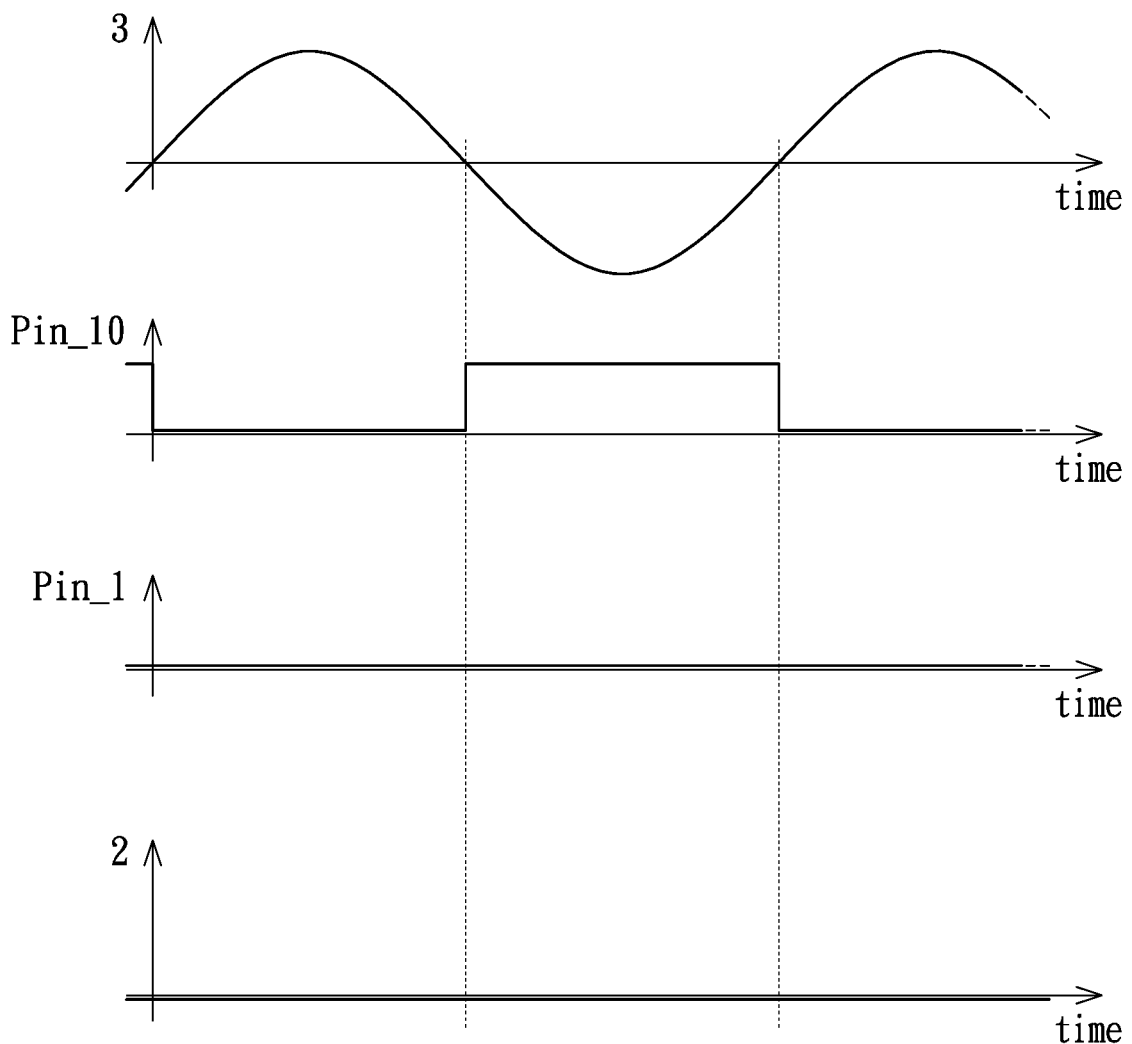
FIG. 5 is a voltage waveform diagram of a microcontroller based electronic switch when the electronic switch operating in the on/off switch control mode is in cut-off state according to an exemplary embodiment of the present disclosure.
Figure 6:
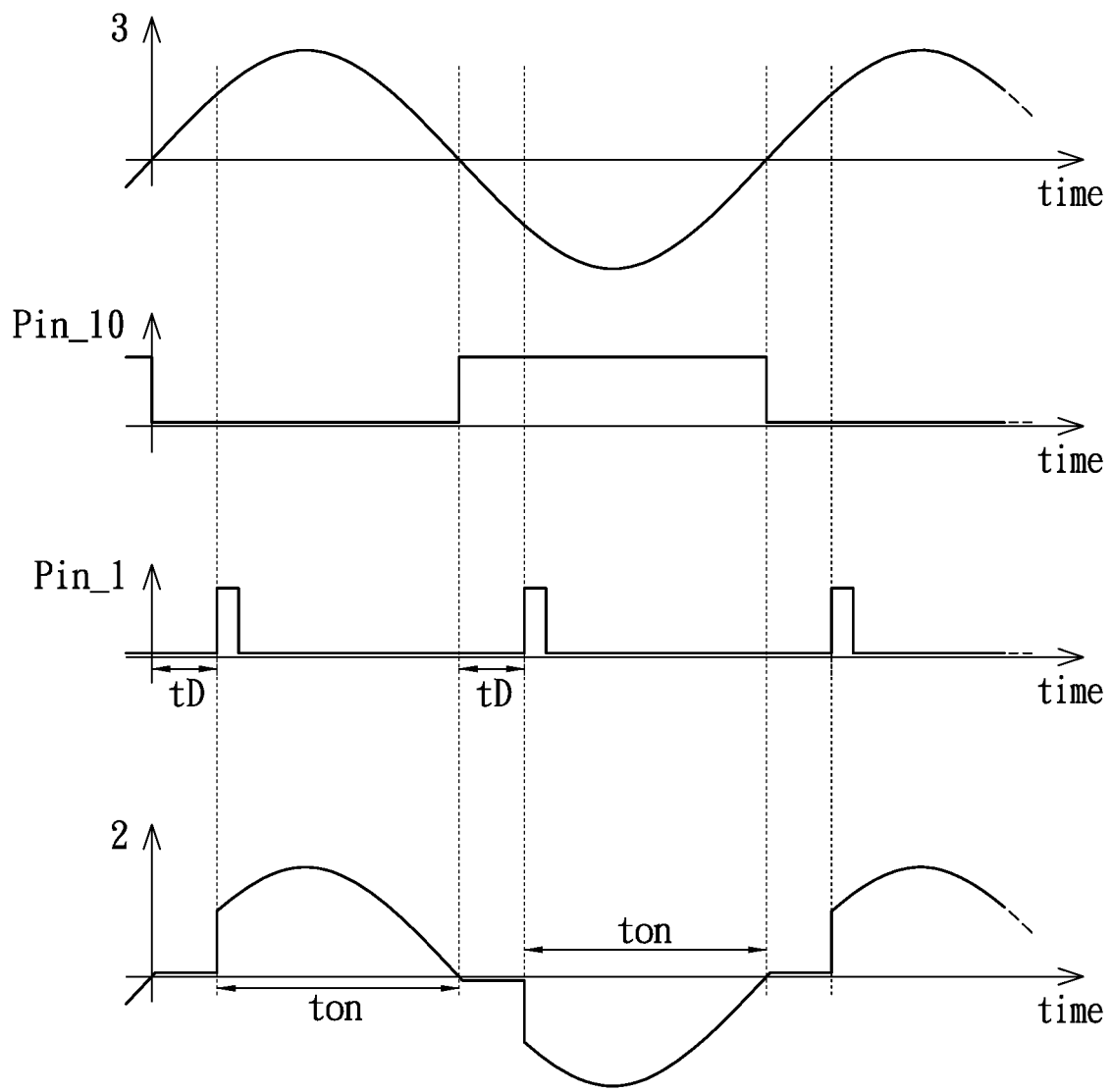
FIG. 6 is a voltage waveform diagram of a microcontroller based electronic switch when the electronic switch operating in the on/off switch control mode is in conduction state according to an exemplary embodiment of the present disclosure.
Figure 7:
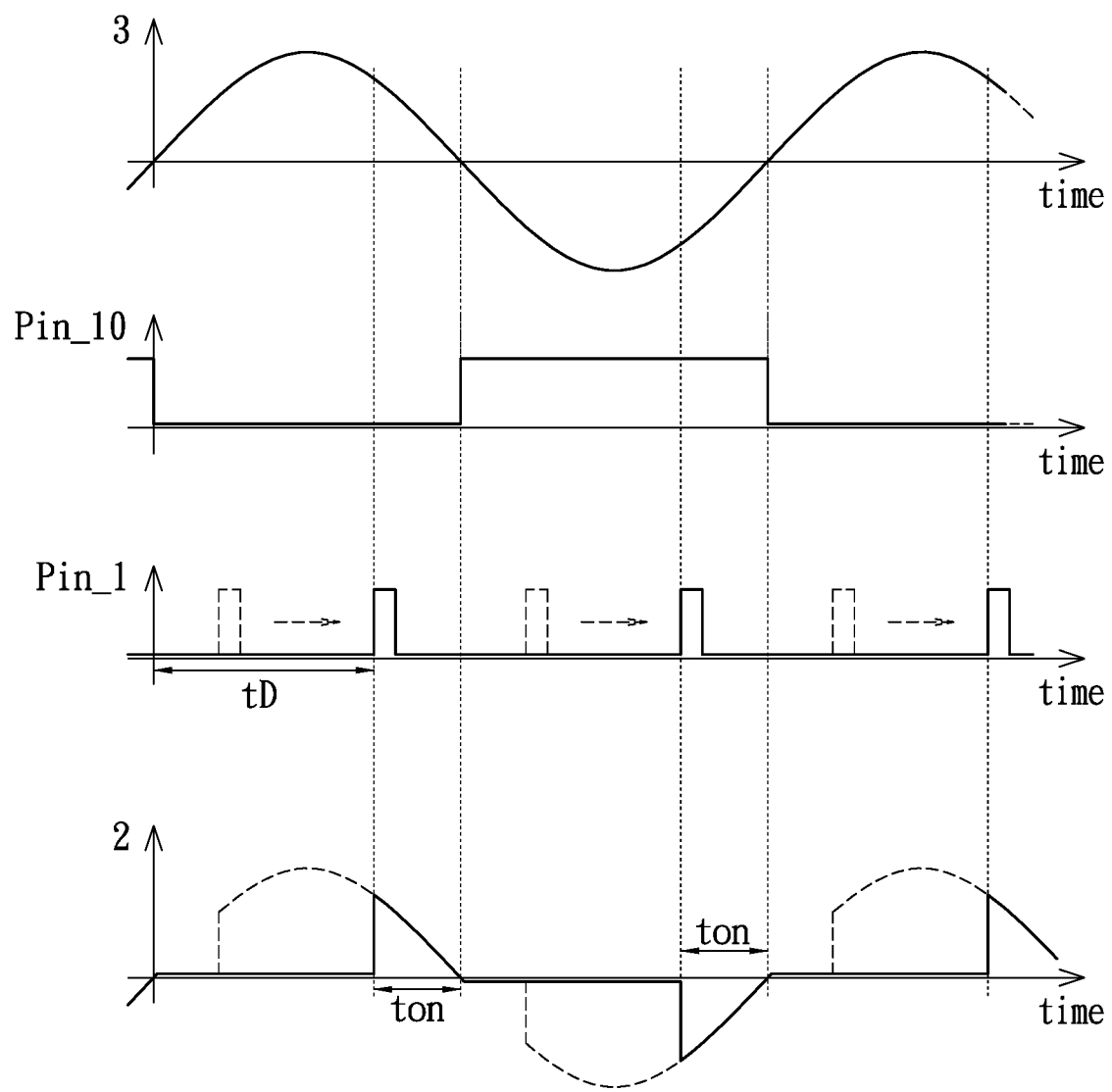
FIG. 7 is a voltage waveform diagram of a microcontroller based electronic switch operating in the dimming control mode according to an exemplary embodiment of the present disclosure.

Refer to FIG. 5, FIG. 6 and FIG. 7 in accompanying FIG. 2 and FIG. 4. According to an exemplary embodiment of the present disclosure, FIG. 5 is a voltage waveform diagram of a microcontroller based electronic switch in cut-off state when operating in on/off switch control mode, FIG. 6 is a voltage waveform diagram of a microcontroller based electronic switch in conduction state when operating in on/off switch control mode, and FIG. 7 is a voltage waveform diagram of a microcontroller based electronic switch when operating in dimming control mode. In FIG. 5, FIG. 6, and FIG. 7, the voltage waveforms as shown from the top are, respectively, a sine wave output from the AC power source 3, an output signal of the zero-crossing-point detector 13 that is fed to pin pin_10 of the microcontroller 12, an output signal from the pin pin_1 of the microcontroller 12, and a voltage waveform between the two ends of the load 2. The voltage waveforms are used to describe the interactions related to the program of the microcontroller 12 and the microcontroller based electronic switch 1 in the above mentioned two working modes. As already described above, the voltage signal generated by the zero-crossing-point detector 13 is a square wave with a low and a high voltage, which is fed to the pin pin_10 of the microcontroller 12 and, to be explained later, served as an external interrupt trigger signal. The voltage signal from the pin pin_1 of the microcontroller 12 is sent to the gate of the triac T1 to control the conduction state of the triac T1.

In the program loops corresponding to the on/off switch control mode and the dimming control mode, the microcontroller 12 utilizes the external interrupt control technique to generate voltage pulses synchronized with AC power. To accomplish it, the program of the microcontroller 12 has a setup with the voltage level variations at the pin pin_10 as external interrupt trigger signals. Since the time point of high or low voltage level variation in the signal generated by the zero-crossing-point detector 13 is the zero crossing point of AC sine wave, the external interrupt process is automatically triggered at the zero crossing point of the AC power source 3, and the related meaning of the details are further described in FIG. 6 and FIG. 7.

Referring to FIG. 5 in accompanying FIG. 2 and FIG. 4, the program of the microcontroller 12 starts from the loop of steps S1 and S2 of on/off switch control mode, wherein the microcontroller based electronic switch 1 is off. The program of the microcontroller 12 scans the voltage at the pin pin_3. If the voltage at the pin pin_3 is a high voltage, the microcontroller 12 generates a zero voltage at the pin pin_1, which is fed to the gate of the triac T1 to turn it off. For no current flowing through the triac T1, the voltage between the two ends of the load 2 is zero in each AC cycle.

Refer to FIG. 6 in accompanying FIG. 2 and FIG. 4. If the program of the microcontroller 12 detects a low voltage at the pin pin_3, the program of microcontroller 12 jumps to steps S3 and S4 of on/off switch control mode, wherein the microcontroller based electronic switch 1 is on. The microcontroller 12 scans within a few microseconds the voltage at the pin pin_10. The external interrupt happens in each AC half cycle (of some milliseconds) at the time point of voltage level variation in the square wave signal. In the external interrupt process, no other program is executed, instead the program is commanded to go back to the main program instantly. The program of the microcontroller 12 is designed based on the time point when the external interrupt occurs, which is also the zero crossing point of the AC power source 3. After a delay time tD with respected to the time point of the external interrupt, the program of the microcontroller 12 generates a zero-crossing-point time-delay pulse at the pin pin_1. The signal provided from the pin pin_1 is a zero-crossing-point time-delay pulse having a delay time tD after the zero crossing point of AC power. The zero-crossing-point time-delay pulse is generated both in the positive and negative half-cycle of the AC power source 3, and used to trigger in synchronization with AC power source 3 the triac T1 into conduction, such that the AC power source 3 delivers in each half AC cycle equal electric power to the load 2 which is in proportion to a conduction time ton of the triac T1. In contrast with the AC power source 3 and the zero crossing point delay pulse, the voltage waveform on the load 2 is depicted in FIG. 6, and the conduction time ton is designated.

In the loop of steps S3 and S4 of the microcontroller based electronic switch 1 being on, the delay time tD of the zero-crossing delay voltage pulse is a fixed value to make a constant average electric power delivered to the load 2. By designing a minimum time delay tD, the conduction time ton of the triac T1 can reach the maximum to make the maximum electric power transmission to the load 2. If the load 2 is an electric light source and the microcontroller based electronic switch 1 is alternatively switched in the conduction or cut-off state, the light source emits respectively the darkest or the brightest luminance. In practice, the load 2 can be an incandescent bulb, a fluorescent light, an AC LED diode or a light emitting diode module. If the load 2 is a light emitting diode module, the light-emitting diode module is connected between output ports of a full-wave rectification bridge.

Refer to FIG. 7 in accompanying FIG. 2 and FIG. 4. In the loop of steps S3 through S6, the microcontroller based electronic switch 1 is on, the program of the microcontroller 12 scans the voltage at the pin pin_3. If the sensing signal fed to the pin pin_3 is a low voltage with the time length Ts longer than nTo (n≥2), the program of the microcontroller 12 jumps to the loop of steps S8 through S10 for executing the dimming control mode. When the microcontroller based electronic switch 1 is in the dimming control mode, the program of the microcontroller 12 scans the voltage at the pin pin_10, so as to generate a zero-crossing-point time-delay pulse with a delay time tD at the pin pin_1. Simultaneously, the program of the microcontroller 12 scans the voltage at the pin pin_3. If the detected sensing voltage at the pin pin_3 is a low voltage with different time length Ts, the program continuously increases the delay time tD of the zero-crossing-point time-delay pulse in proportion to the time length Ts. If the delay time tD reaches the maximum, the program of the microcontroller 12 responds no more to the detected low voltage at the pin pin_3. When the delay time tD is increased, the conduction time ton of triac T1 is decreased as shown in FIG. 7. The average electric power delivered to the load 2 is thus accordingly reduced. In FIG. 7, the voltage waveforms are depicted to show that the program of the microcontroller 12 shifts the delay time tD step by step corresponding to the low voltage sensing signal when the microcontroller based electronic switch 1 operates in the dimming control mode.

In practice, the load 2 can be a light-emitting diode, especially, AC-LED. The AC-LED has a cut-in voltage $V_t$ for conducting current. During a sinusoidal period of the AC power source 3, if the voltage magnitude of the AC power source is still lower than the cut-in voltage $V_t$ of the load 2 and when the pin pin_1 provides a zero-crossing-point time-delay pulse, the bi-directional controllable semiconductor switching element 14 cannot be triggered stably into conduction. Therefore, by designing the zero-crossing-point time-delay pulse as shown in FIG. 6 and FIG. 7, the cut-in voltage $V_t$ of the load 2 should be considered. Thus, to ensure that the bi-directional controllable semiconductor switching element 14 can be triggered stably, it is necessary to limit the delay time tD in an appropriate range as follows:

$$t_o < tD < 1/(2f) - t_o,$$

wherein $t_o = (1/2\pi f)\sin^{-1}(V_t/V_m)$, f is the frequency and $V_m$ is the voltage amplitude of the AC power source 3. The knowledge for stable triggering provides mean for accurate design of the zero-crossing-point time-delay pulse that enables an efficient electric power transmission from the AC power source to the load 2 which may have specific impedance or threshold voltage.

Figure 8A:
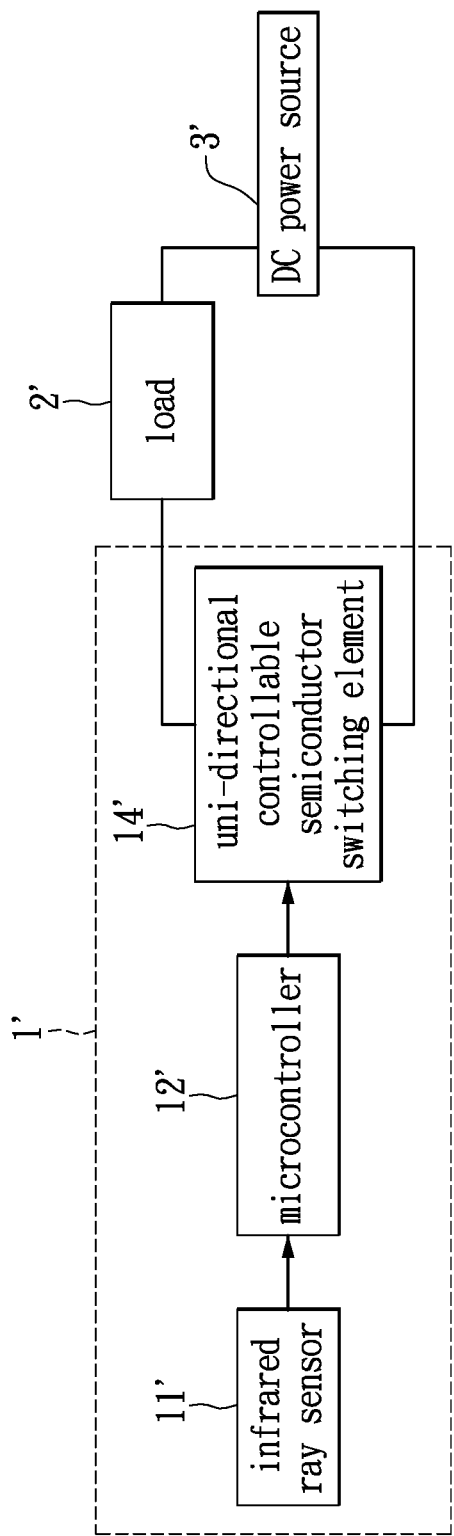
FIG. 8A is a block diagram of a microcontroller based electronic switch for a DC power source according to an exemplary embodiment of the present disclosure.

In addition, the concept of the present disclosure can also be applied to the DC power source, wherein the controllable semiconductor switching element and the program of the microcontroller 12 should be modified slightly, and the zero-crossing-point detector should be removed. Referring to FIG. 8A, FIG. 8A is a block diagram of a microcontroller based electronic switch 1' using an infrared ray sensor as a detection means for a DC power source according to an exemplary embodiment of the present disclosure. The microcontroller based electronic switch 1' is connected to a DC power source 3' and a load 2' in a serial fashion, so as to control the electric power of the DC power source 3' delivered to the load 2'. Compared to FIG. 1, the microcontroller based electronic switch 1' in FIG. 8A comprises an infrared ray sensor 11', a microcontroller 12', and a uni-directional controllable semiconductor switching element 14'. In practice, the uni-directional controllable semiconductor switching element 14' can be a bipolar junction transistor (BJT) or a metal-oxide-semiconductor field-effect transistor (MOSFET). The load 2' can be a light-emitting diode or an incandescent bulb, but present disclosure is not limited thereto.

Figure 8B:
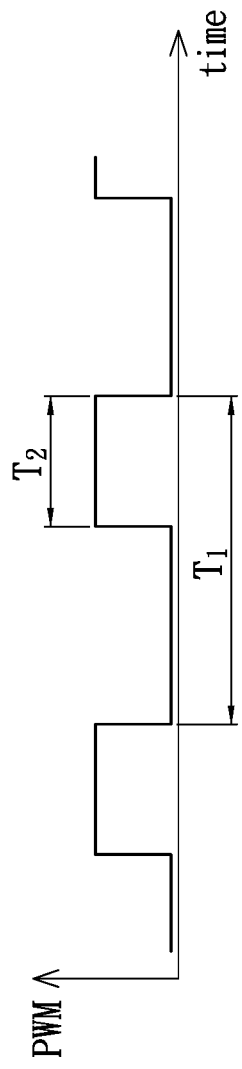
FIG. 8B is a voltage waveform diagram of the pulse width modulation voltage signal according to an exemplary embodiment of the present disclosure.

Referring to FIG. 3 and FIG. 8B, the infrared ray sensor 11' detects a user's hand, for instance, and converts the outcome into message carrying low voltage sensing signals readable to the microcontroller 12'. The microcontroller 12' decodes the low voltage sensing signal according to the program designed and written in its OTPROM, so as to make the microcontroller based electronic switch 1' operate in on/off switch control mode and dimming control mode accordingly. In the on/off switch control mode when the microcontroller based electronic switch 1' is off, the program of the microcontroller 12' generates a zero voltage fed to the gate of the uni-directional controllable semiconductor switching element 14' so as to turn off the switching element 14'. In the on/off switch control mode when the microcontroller based electronic switch 1' is on, the program of the microcontroller 12' generates PWM (pulse-width-modulation) signal fed to the gate of the uni-directional controllable semiconductor switching element 14' so as to turn on the switching element 14' such that a fixed electric power is transmitted from the DC power source 3' to the load 2'.

FIG. 8B is a voltage waveform diagram of the PWM signal according to an exemplary embodiment of the present disclosure. The PWM voltage signal is a square wave signal comprising a zero voltage (or low-voltage) and a high voltage, wherein the high voltage drives the uni-directional controllable semiconductor switching element 14' into conduction. If the time length of the high voltage is $T_2$ and the period of the PWM voltage signal is $T_1$, the average electric power delivered to the load 2' through the uni-directional controllable semiconductor switching element 14' is proportional to the ratio $T_2/T_1$, which is by definition the duty cycle of the PWM voltage signal and is denoted as $\delta = T_2/T_1$. In the on/off switch control mode, the program of the microcontroller 12' generates the PWM voltage signal with maximum duty cycle to make the microcontroller based electronic switch 1' deliver the maximum average electric power to the load 2'. In the dimming control mode, the program of the microcontroller 12' scans the low voltage sensing signal provided from the infrared ray sensor 11'. If the detected low voltage sensing signal has different time length Ts, the program of the microcontroller 12' decreases the duty cycle of the PWM voltage signal in proportion to each time length Ts, to gradually reduce the electric power sent to the load 2'.

In general, it is frequently to produce high-order harmonic interference when a bi-directional controllable semiconductor switching element works with conduction phase control technique to transmit AC electric power thereof. To eliminate harmonic interference, the concept of the present disclosure can also be applied to the case of AC power source without using triac element and zero-crossing-point detector.

Figure 9:
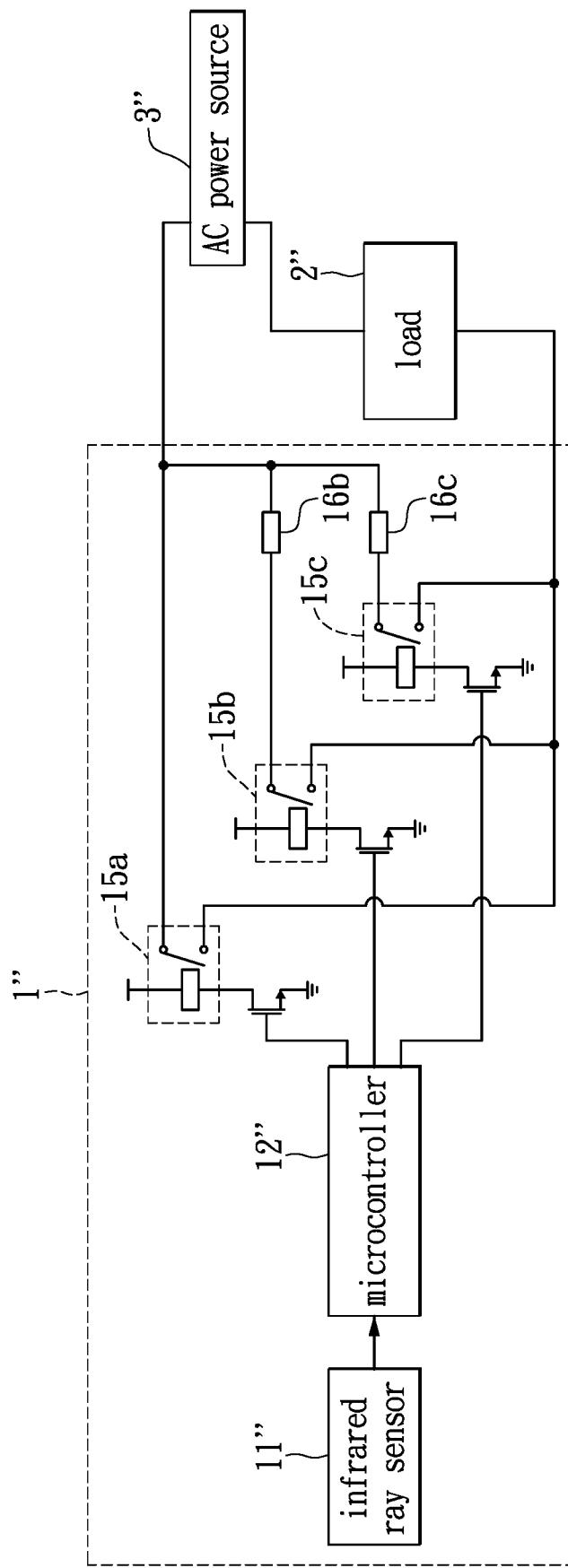
FIG. 9 is a block diagram of a microcontroller based electronic switch for AC power source according to another one exemplary embodiment of the present disclosure.

FIG. 9 is a block diagram of a microcontroller based electronic switch 1" using an infrared ray sensor as a detection means for AC power source according to another one exemplary embodiment of the present disclosure. The microcontroller based electronic switch 1" is connected to a load 2" and an AC power source 3" in the serial fashion. Compared to FIG. 1, the microcontroller based electronic switch 1" comprises an infrared ray sensor 11", a microcontroller 12", and three relays 15a, 15b, and 15c connected to different types of electrical impedances, for example, capacitors, respectively. Thus, the three relays 15a, 15b, and 15c together with impedance elements 16b and 16c form three different conducting paths with the different impedances. The three relays 15a, 15b, and 15c are arranged parallel to each other, and all of them are connected to the load 2" and the AC power source 3". In other words, each of the three relays 15a, 15b, and 15c is connected to the load 2" and the AC power source 3" in the serial fashion. In practice, the load 2" can be an electric fan, an AC-LED or an incandescent bulb.

The microcontroller 12" has its three pins respectively connected to the gates of MOSFET (metal-oxide-semiconductor field-effect transistor), which drive respectively the three relays 15a, 15b, and 15c. When the three pins of the microcontroller 12" simultaneously provide zero voltage to the three MOSFETs, the three relays 15a, 15b, and 15c are cut-off, and the microcontroller based electronic switch 1" is cut-off or opened. When one pin of the microcontroller 12" generates a high voltage fed to one MOSFET, and the other two pins are zero voltage, merely one corresponding relay is in conduction state and the other two relays are cutoff. Accordingly, when the first relay 15a is in conduction state, a first-level electric power is transmitted directly from the AC power source 3" to the load 2"; when the second relay 15b is in conduction state, a second-level electric power is transmitted through the impedance 16b to the load 2"; when the third relay 15c is in conduction state, a third-level electric power is transmitted through the impedance 16c to the load 2".

Referring to FIG. 3 and FIG. 9, the infrared ray sensor 11' detects a user's hand, for instance, and converts the outcome into a low voltage sensing signal readable to the microcontroller 12". The program of the microcontroller 12" controls the microcontroller based electronic switch 1" to operate in on/off switch control mode and in dimming control mode according to the detected infrared ray signal. In the on/off switch control mode, when the microcontroller based electronic switch 1" is off, all three pins of the microcontroller 12" respectively generates zero voltage fed to the three gates of MOSFETs so as to turn off all relays 15a-15c. In the on/off switch control mode, when the microcontroller based electronic switch 1" is on, the microcontroller 12" generates a high voltage from one pin, and zero voltage from the other two pins, that only the first relay 15a is in conduction state so as to deliver the first-level AC power to the load 2". In dimming control mode, the program of the microcontroller 12" scans the low voltage sensing signal provided by the infrared ray sensor 11'. When according to the low voltage sensing signal, the program of the microcontroller 12' generates a high voltage from the second or the third pin and sets the other two pins at zero voltage, then one of the relays 15b and 15c is activated to be in conduction state, so that an AC electric power of the second-level or the third-level is transmitted to the load 2". In other words, the microcontroller 12 generates zero voltage or high voltage, respectively, to control the three relays 15a, 15b, and 15c to be opened or shorted in response to infrared ray sensing signal.

Although the above description of the exemplary embodiments takes infrared ray sensor as a means for detecting user's motion and generating sensing signal, the technology of the present disclosure has no restriction on the types of detection method used. There are quite a few detection methods including touch or touchless means that can be applied to the present invention of the multifunctional electronic switch such as an infrared ray sensor (touchless interface), an electrostatic induction sensor (also touchless interface), or a push button sensor (direct touch interface). Each detection method may require different motion control signals to be played by the user but the core technology remains using the time length and format of the binary sensing signals as the message carrier for transmitting the user's choice of working mode. The microcontroller thereby decodes or interprets the received message carrying sensing signals according to the software program written in the OTPROM, recognizes the working mode selected by the user and activates the corresponding loop of subroutine for performance execution.

Similar to the infrared ray sensor, the electrostatic induction sensor can also create a touchless interface. The electrostatic induction sensor generally comprises a copper sheet sensing unit with adequately design shape and packaged with non-conductive material. Such copper sheet sensing unit is further electrically connected to a signal generating circuit similar to the infrared detection sensor unit. The copper sensing unit serves as an anode pole and the human body (normally refers to finger or hand) serves as a cathode pole to form a configuration of a capacitor. When the user's hand is approaching the copper sensing unit, the electric charges are being gradually induced and built up on the surface of the copper sensing unit with increasing density. Consequently, the copper sensing unit changes its electric state from zero voltage state to a low voltage state. Such low voltage level will continue to grow as the user's hand moving closer and closer to the copper sensing unit till reaching a designed threshold point which will trigger the detection circuit to generate a low voltage sensing signal. The distance between the copper sensing unit and the space point where the threshold voltage incurs is defined as the effective detecting zone. Similarly but reversely when the user's hand is moving out from an operative point of the detecting zone of the copper sensing unit, the voltage level will continue to decline till passing the designed threshold point which will trigger the cutoff of the low voltage sensing signal. The time length of the low voltage sensing signal so generated or in other words the time period between moving in and moving out the effective detecting zone can be designed to represent the selection of different working modes. If the time length is shorter than a preset time interval, it means the user's selection is to perform the on/off switch control mode; if the time length is longer than a preset time interval, it means the user's selection is to perform the diming or power level control mode; if two or more low voltage sensing signals are consecutively generated within a preset time interval, in other words the user's hand moving in and out the detecting zone twice or swing across the detecting zone back and forth, it means the user's selection is to perform the delay timer management mode.

For direct touch detection sensors, such as a touch sensor or a push button detection sensor, one touch on the conductive base or one instant press on the control button within a preset time interval will trigger the generation of a single sensing signal which will cause the microcontroller to execute the subroutine of the on/off switch control mode; a long touch on a conductive base or a long press on a control button longer than the preset time interval will trigger the generation of a single sensing signal with time length longer than the preset time interval and the microcontroller responsively will execute the subprogram of dimming control or power level control mode. Double instant touches on the conductive base or double instant press on the control button within a preset time interval will trigger the generation of two consecutive sensing signals which will cause the microcontroller to execute the subroutine of delay timer management mode.

Figure 10A:
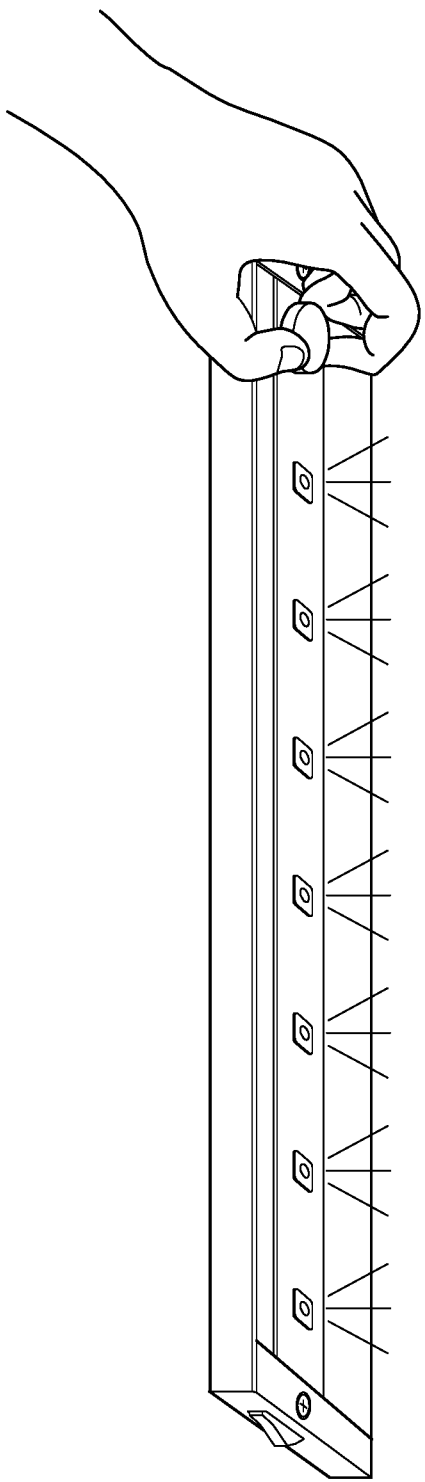
FIG. 10A is an application diagram of a traditional popular piece of under cabinet light with LED as light source.
Figure 10B:
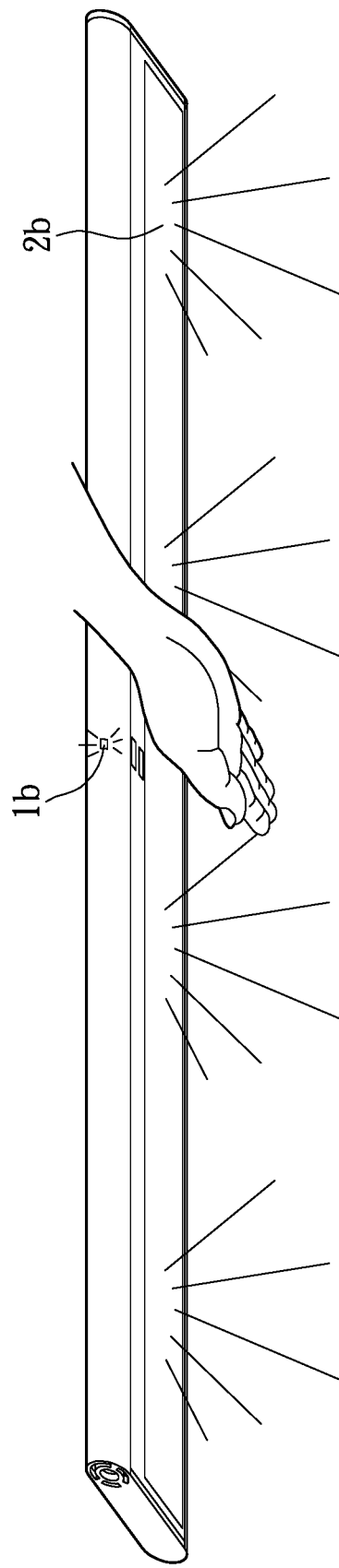
FIG. 10B is an application diagram of an exemplary embodiment of the present disclosure for a LED under cabinet light featured with a touchless interface between the user and the under cabinet light.

FIG. 10A and FIG. 10B together provide a good show case to prove the value of the user friendly concept of the present invention. Picture shown in FIG. 10A is a popular piece of under cabinet light with LED as light source. A manual on/off control switch is built on the right hand side of the rectangular housing and a dimming knob is built on the front panel facing downward. Under cabinet lights are always installed underneath the kitchen cabinets to provide sufficient indirect illumination to the user to do the kitchen work. The under cabinet lights and the kitchen cabinet are always installed at approximately the breast level of the users for the convenience of doing kitchen work so that the users can comfortably do the kitchen work without bending their body and having to work in a glaring environments. The current market piece as shown in FIG. 10A is not an user friendly device; the user has to either use his or her hand to blindly search the locations of the on/off switch and the dimming knob or to bend his or her body to find the exact locations of the two control units for operation. Additionally, the direct touch to control the on/off switch and dimmer also brings up concerns of contagion and contamination in preparing food in kitchen area and the housewives may have to wash their hands more frequently than necessary.

FIG. 10B is an application of the present invention for a LED under cabinet light featured with a touchless interface between the user and the under cabinet light. A motion of single swing of user's hand across the detecting zone of the microcontroller based electronic switch 1b will activate the on/off switch mode alternately turning on and turning off the under cabinet light 2b. A motion of placing user's hand in the detecting zone exceeding a preset time interval will activate the diming mode to allow selection of brightness or power level. And a motion of double swings of user's hand across the detecting zone within a preset time interval will activate the delay timer management mode to provide the user with a transitional illumination to leave the kitchen area before the light is completely turned off. The three basic working modes can be easily managed with simple motions played by the user without the hassles of having to blindly search the control switch and dimming knob, or to bend body to find the location of the control elements or to frequently wash hands to avoid concerns of contagion and contamination in preparing food. This is truly a very user friendly exemplary embodiment of the present disclosure compared with what are currently being sold in the market as shown in FIG. 10A.

Figure 10C:
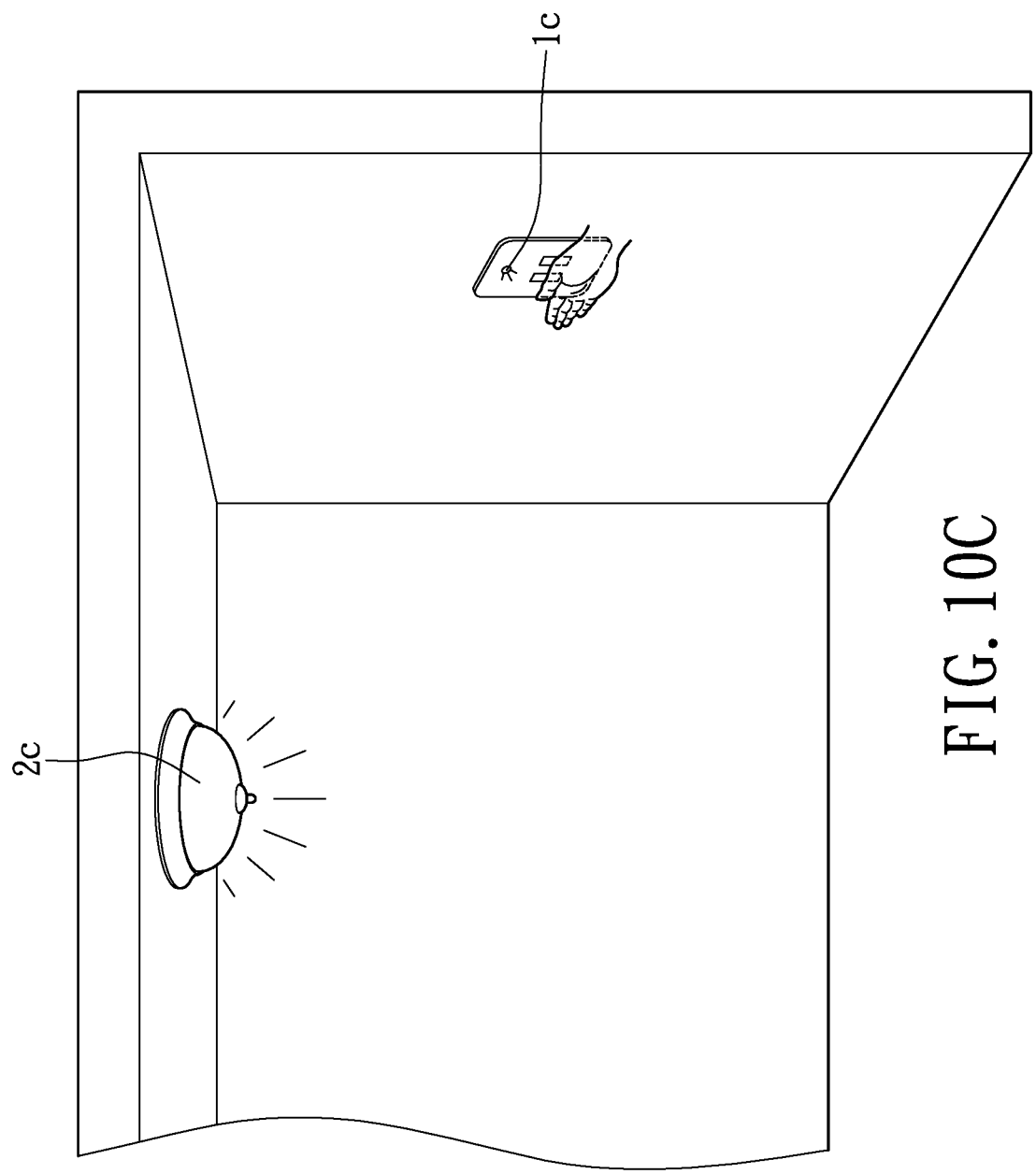
FIG. 10C is an application diagram of an exemplary embodiment of the present disclosure for a wall switch construction electrically connected to a ceiling light for the performance of three working modes.
Figure 11A:
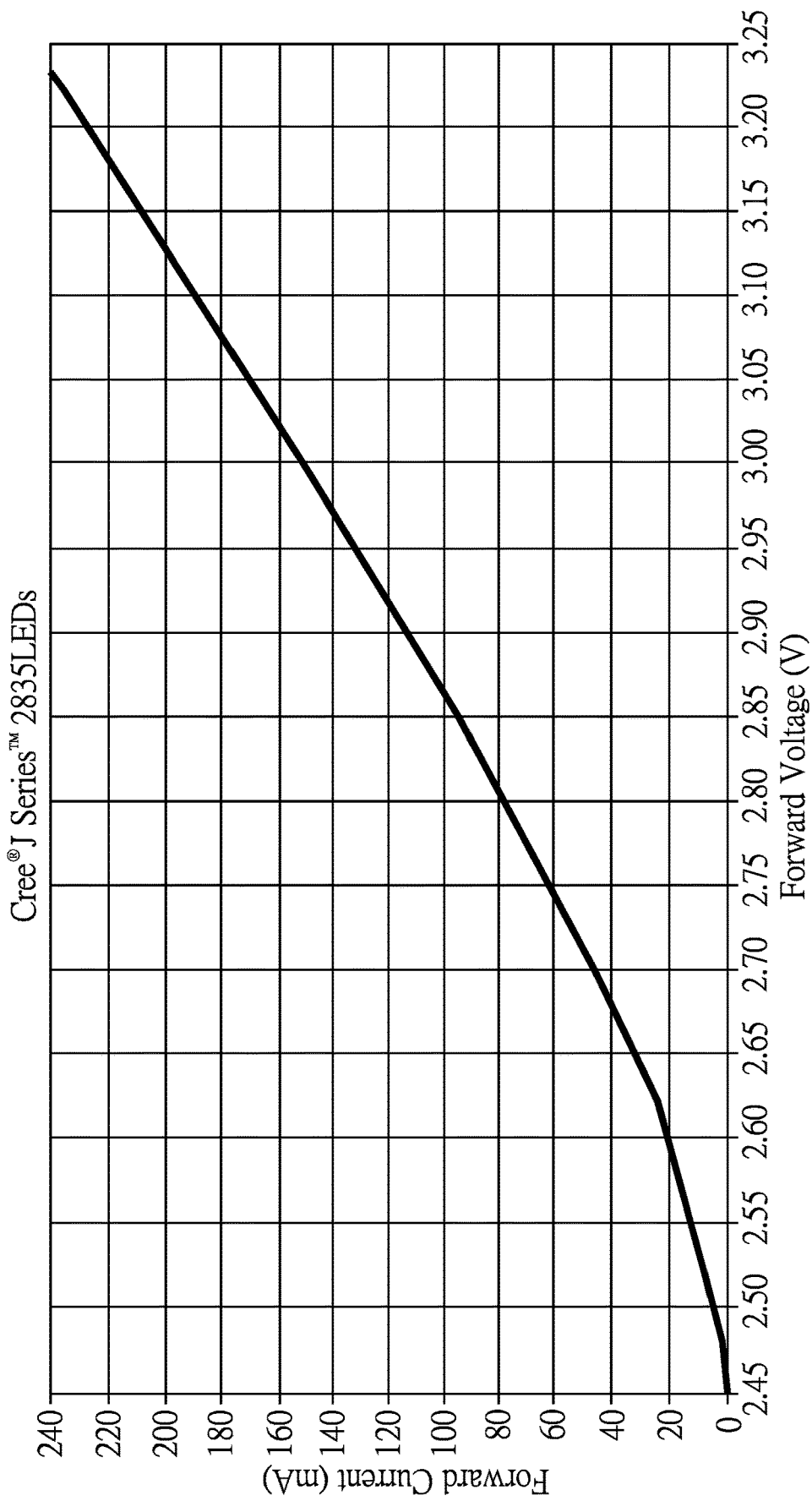
FIGS. 11A, 11B, 11C and 11D schematically and respectively show V-I relationship charts (Forward Current vs. Forward Voltage) for a white LED chip from each of 4 different LED manufacturers.
Figure 11B:
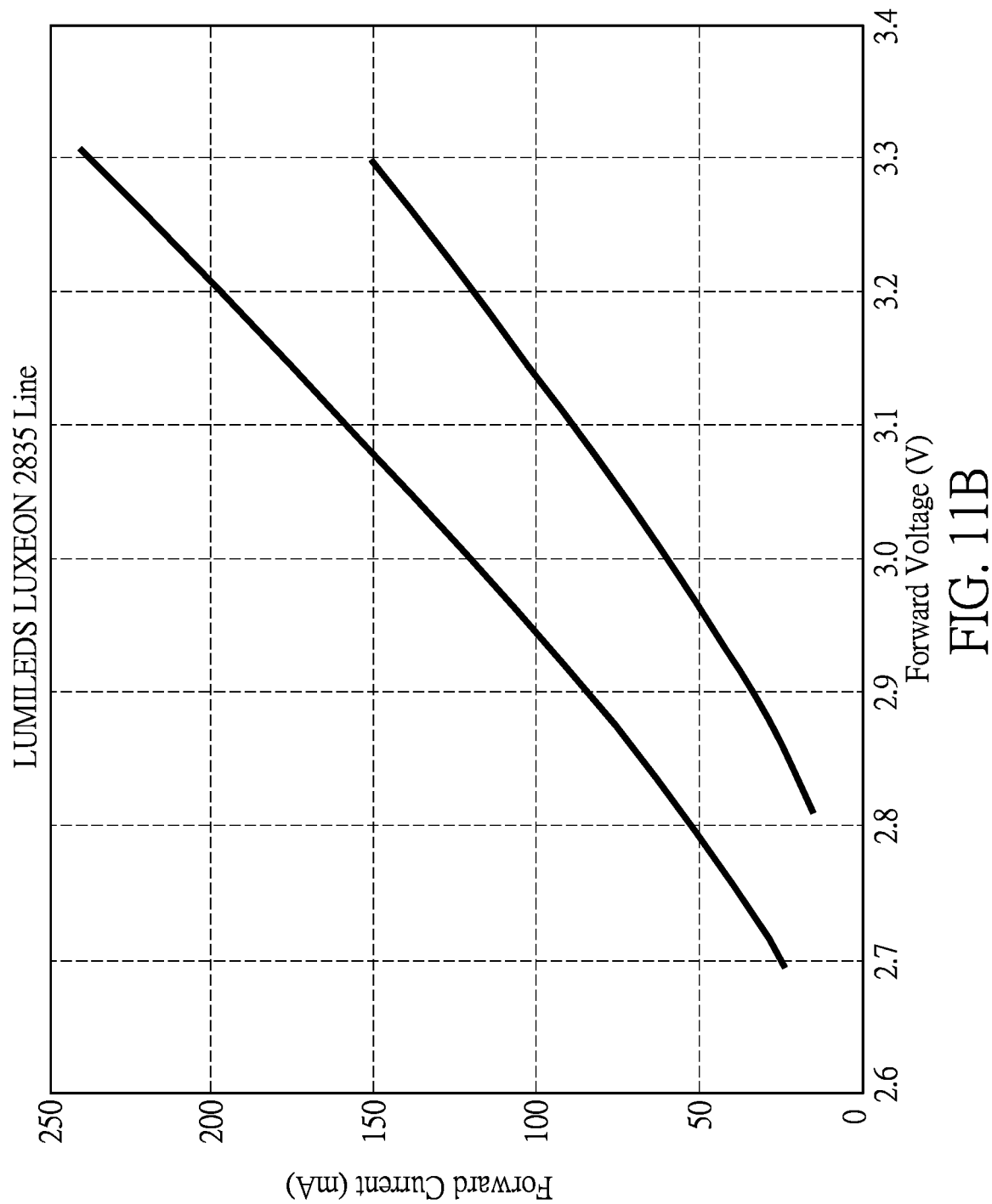
Figure 11C:
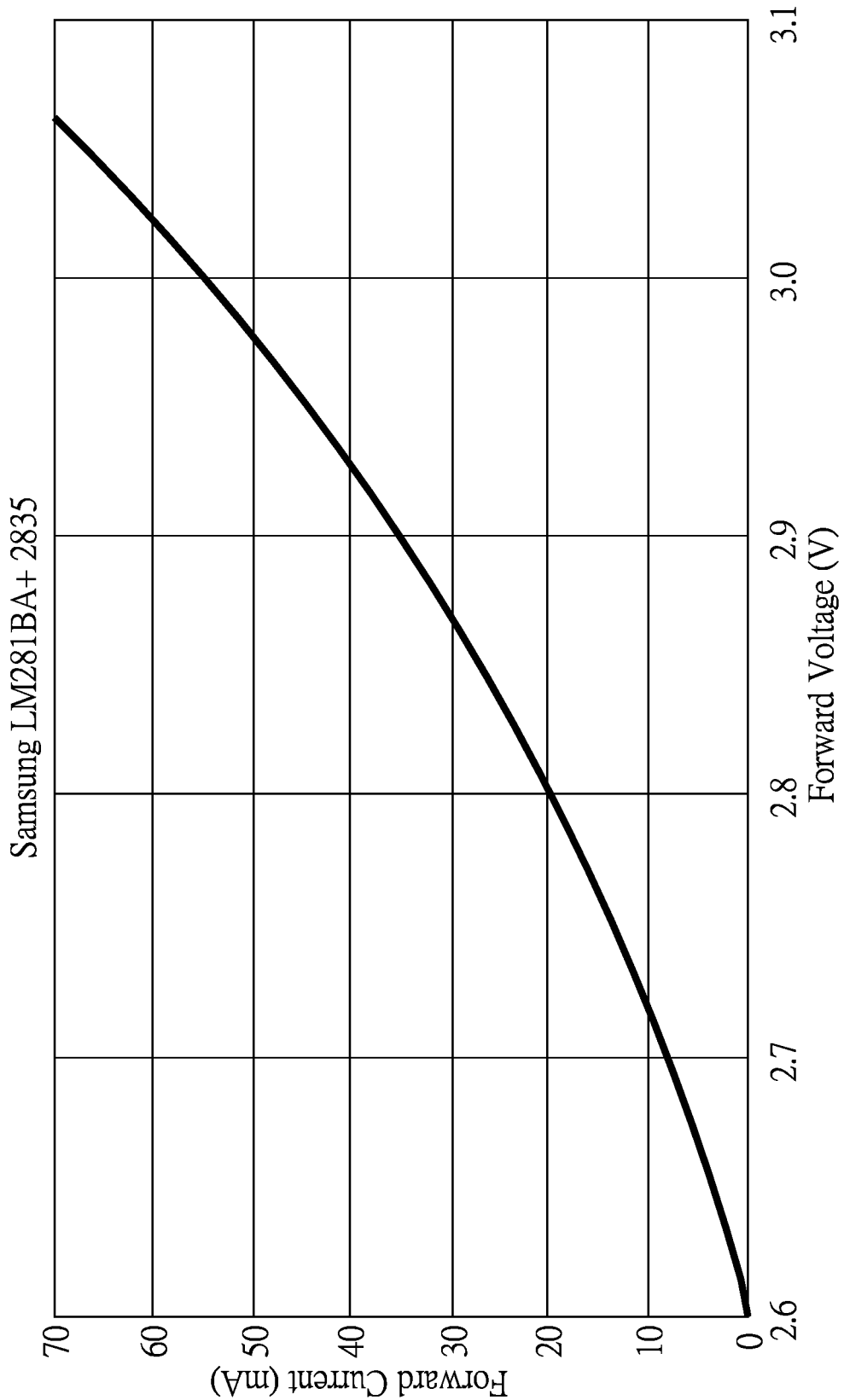
Figure 11D:
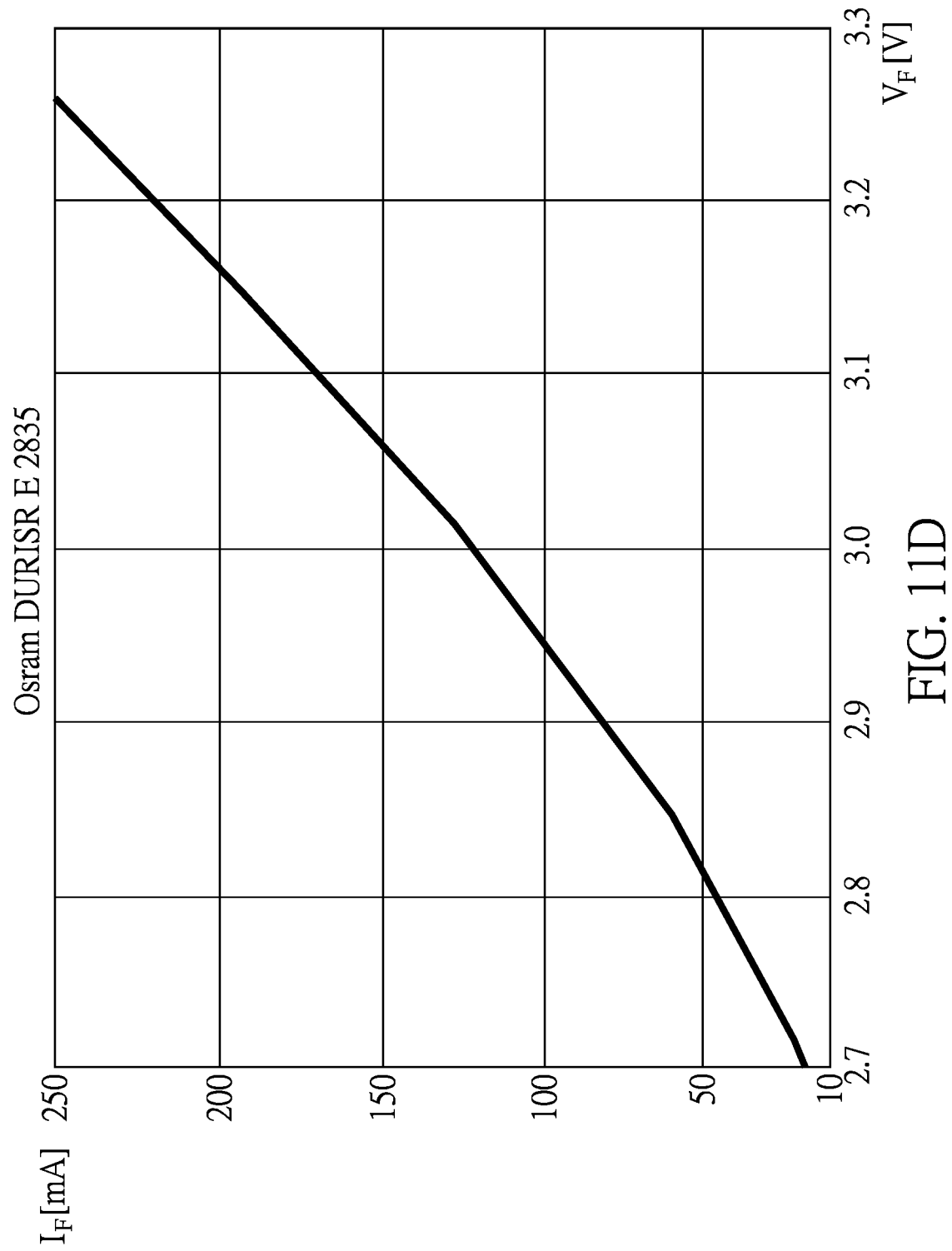

FIG. 10C is another application of the present invention for a wall switch construction electrically connected to a ceiling light for the performance of three working modes. A motion of single swing across the detecting zone in front of the wall switch 1c by user's hand within a preset time interval will activate the on/off switch mode alternately turning on and turning off the ceiling light 2c. A motion of placing user's hand in front of the wall switch 1c and stay in the detecting zone for a time period longer than a preset time interval will activate the dimming mode to allow the user to select the desired brightness. And a motion of double swings across the detecting zone within a preset time interval will activate the performance of the delay timer management mode to provide the user a transitional illumination to leave for the next location before the ceiling light is completely turned off. This new wall switch when compared with conventional switch represents a very user friendly innovation from the easy operation point of view. Additionally, the delay timer mode helps to relieve the inconvenience of either having to live with a dark environment after turning off the light or using a three way switch system to provide transitional illumination. The conventional touch based wall switch is also a virus gathering spot because of use by many users and the issue of contagion and contamination is always a valid concern even outside the surgical space.

When the light source of the lighting load 2 is confined to the use of an LED load, the compliance and satisfaction of a voltage operating constraint attributable to the unique electrical characteristics of the LED load is "critical" to a successful performance of an LED lighting device. Any LED lighting device failing to comply with the voltage operating constraint attributable to the unique electrical characteristics of an LED load is bound to become an useless art. This is because the LED as a kind of solid state light source has very different electrical characteristics for performing light emission compared with conventional light source such as incandescent bulbs or fluorescent bulbs. For instance, for a white light or blue light LED there exists a very narrow voltage domain ranging from a minimum threshold voltage at 2.5 volts to a maximum working voltage at 3.3 volts, in order to successfully operate the LED; in other words, when a forward voltage imposed on the LED is lower than the minimum threshold voltage, the LED is not conducted and therefore no light is emitted, when the forward voltage exceeds the maximum working voltage, the heat generated by a forward current could start damaging the construction of the LED. Therefore, the forward voltage imposed on the LED is required to operate between the minimum threshold voltage and the maximum working voltage. In respect to the LED load of the lighting load 2 the cut-in voltage $V_t$ of ACLEDs is technically also referred to as a minimum threshold voltage attributable to PN junction semiconductor structure manufactured in LEDs. More specifically, the LED is made with a PN junction semiconductor structure "inherently" featured with three unique electrical characteristics, the first characteristic is one-way electric conduction through the PN junction fabricated in the LED, the second electrical characteristic is a threshold voltage $V_{th}$ required to trigger the LED to start emitting light and the third electrical characteristic is a maximum working voltage $V_{max}$ allowed to impose on the LED to avoid a thermal runaway to damage or burn out the semiconductor construction of the LED. The described cut-in voltage $V_t$ has the same meaning as the above mentioned threshold voltage $V_{th}$ which is a more general term to be used for describing the second electrical characteristic of a PN junction semiconductor structure. Also because the cut-in voltage $V_t$ is specifically tied to forming a formula to transform the threshold voltage into a corresponding time phase of AC power for lighting control, it is necessary to use the term $V_{th}$ as a neutral word for describing the LED electrical characteristics to avoid being confused with the specific application for ACLED alone. Additionally, it is to be clarified that the term $V_m$ is related to the amplitude of the instant maximum voltage of an AC power source which has nothing to do with the third electrical characteristic Vmax of an LED load.

An LED chip is a small piece of semiconductor material with at least one LED manufactured inside the semiconductor material. A plurality of LEDs may be manufactured and packaged inside an LED chip for different levels of wattage specification in order to meet different illumination need. For each LED chip designed with a different level of wattage specification there always exists a narrow voltage domain $V_{th}<V<V_{max}$, wherein $V_{th}$ is the threshold voltage to enable the LED chip to start emitting light and $V_{max}$ is the maximum working voltage allowed to impose on the LED chip to protect the LED chip from being damaged or burned out by the heat generated by a higher working voltage exceeding $V_{max}$.

For an LED load configured with a plurality of the LED chips in any LED lighting device, regardless such LED load being configured with ACLED chips or DC LED chips, the working voltage of each single LED chip is required to operate in a domain between a threshold voltage $V_{th}$ and a maximum working voltage $V_{max}$ or $V_{th}<V<V_{max}$ and the working voltage of the LED load comprising N pieces of LED chips connected in series is therefore required to operate in a domain established by a threshold voltage $N \times V_{th}$ and a maximum working voltage $N \times V_{max}$ or $N \times V_{th}<V<N \times Vmax$, wherein N is the number of the LED chips electrically connected in series. For any LED lighting device comprising an LED load it is required that the LED load in conjunction with an adequate level of power source is configured with a combination of in series and in parallel connections of LED chips such that the electric current passing through each LED chip of the LED load remains at an adequate level such that a voltage V across each LED chip complies with an operating constraint of $V_{th}<V<V_{max}$ featuring electrical characteristics of the LED chip or a voltage V across the LED load configured with N number of LED chips connected in series complies with an operating constraint of $N \times V_{th}<V<N \times V_{max}$. Such narrow operating range therefore posts an engineering challenge for a circuit designer to successfully design an adequate level of power source and a reliable circuitry configured with an adequate combination of in series connection and in parallel connection of LED chips for operating a higher power LED security light.

FIGS. 11A, 11B, 11C and 11D comprise 4 drawings schematically and respectively showing a V-I relationship chart (Forward Current vs. Forward Voltage) for a white light LED chip from each of 4 different LED manufacturers; as can be seen from the chart when a forward voltage V is below a minimum forward voltage at around 2.5 volts, the LED chip is not conducted so the current I is zero, as the forward voltage exceeds 2.5 volts the LED chip is activated to generate a current flow to emit light, as the forward voltage continues to increase, the current I increases. exponentially at a much faster pace, at a maximum forward voltage around 3.3 volts the current I becomes 250 mA which generates a heat that could start damaging the PN junction of the LED chip. The minimum forward voltage (the threshold voltage or cut-in voltage) and the maximum forward voltage are readily available in the specification sheets at each of LED manufacturers, such as Cree, Lumileds, Samsung, Osram, and etc. Different LED manufacturers may have slightly different figures due to manufacturing process but the deviations of differences are negligible. The constraints of minimum forward voltage and maximum forward voltage represent physical properties inherent in any solid state light source. They are necessary matter for configuring any LED lighting products to ensure a normal performance of an LED load.

FIG. 12 is a data sheet showing data of the minimum forward voltages and maximum forward voltages collected from various LED manufacturers. They are fundamental requirements for configuring any LED lighting control devices to ensure a successful performance of any LED lighting device.

In summary, the compliance of voltage operating constraint $V_{th}<V<V_{max}$, featuring electrical characteristics of an LED chip is a critical technology for ensuring a normal performance of the LED load. Failing to comply with such voltage operating constraint can quickly age or seriously damage the semiconductor structure of the LED chip with a consequence of quick lumens depreciation of the LED bulbs and the product lifetime being substantially shortened, which will be unacceptable to the consumers.

The compliance of the operating constraint $V_{th}<V<V_{max}$ is a necessary matter for any LED lighting device though it is not an obvious matter as it requires complicated technologies to calculate and coordinate among an adequate level of power source, a control circuitry and a non-linear light emitting load. For conventional lighting load such as incandescent bulb there exists no such operating constraint. This is why in the past years there had been many consumers complaining about malfunction of LED bulbs that the consumers were frustrated with the fast depreciation of lumens output and substantially shortened product lifetime of the LED bulbs purchased and used. A good example was a law suit case filed by the Federal Trade Commission on Sep. 7, 2010 (Case No. SACV10-01333 JVS) for a complaint against a leading lighting manufacturer for making deceptive LED lamps and making false claims with respect to the life time of their LED lamps and a huge amount of monetary relief was claimed with the Court in the complaint.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A microcontroller based electronic switch, comprising:
   a controllable switching circuitry, electrically connected between an LED load and a power source;
   at least a first external control device, comprising at least a first detection circuitry for detecting and converting a first external control signal generated by operating said first external control into a message carrying sensing signal with a signal format; and
   a microcontroller, designed to interpret and execute said message carrying sensing signal received from said first external control device;
   wherein said microcontroller is electrically coupled with said first external control device and said controllable switching circuitry;
   wherein said microcontroller outputs a control signal to control a conduction state or a cutoff state of said controllable switching circuitry according to said message carrying sensing signal received from said first external control device;
   wherein when said controllable switching circuitry is in said conduction state, said microcontroller further adjusts said control signal to control a conduction rate of said controllable switching circuitry to set an electric power transmission level from said power source to said LED load to perform an illumination level according to said message carrying sensing signal received from said first external control device;
   wherein said signal format of said message carrying sensing signal is a short voltage signal with a signal time length equal to or shorter than a preset time interval, a long voltage signal with a signal time length longer than said preset time interval, a constant voltage signal with a voltage value, a plurality of said short voltage signals, a plurality of said long voltage signals, or a combination of said short voltage signal(s) and said long voltage signal(s);
   wherein when said microcontroller receives said message carrying sensing signal, said microcontroller operates to control said conduction rate of said controllable switching circuitry to perform one of illumination performance control modes including at least an on/off switch control mode, a dimming control mode, an illumination level switching control mode or a delay shutoff control mode according to said signal format of said message carrying sensing signal; and
   wherein the microcontroller is a programmable integrated circuit device or an application specific integrated circuit for implementing at least one of said illumination performance control modes.

2. The microcontroller based electronic switch according to claim 1, wherein said controllable switching circuitry comprises at least a semiconductor switching device, wherein said controllable switching circuitry is an LED driver outputting at least one constant current power to said LED load.

3. The microcontroller based electronic switch according to claim 1, wherein said first external control device is configured with a touchless interface for generating, detecting and converting said first external control signal into said message carrying sensing signal interpretable to said microcontroller.

4. The microcontroller based electronic switch according to claim 3, wherein said touchless interface of said first external control device is configured with an active infrared ray sensor comprising an infrared ray transmitter for emitting infrared light into an area to form a defined detection zone and, an infrared ray receiver for receiving infrared light reflected from an object in said defined detection zone, wherein said infrared ray receiver comprises said detection circuitry for detecting and generating different voltage signals in response to different motions of said object entering and leaving said defined detection zone; wherein when said object enters said defined detection zone, said detection circuitry operates to generate a first voltage sensing signal with said signal time length corresponding to a time duration of said object entering and staying in said defined detection zone; wherein when said object leaves said defined detection zone, said detection circuitry operates to generate a second voltage signal to conclude said signal time length of said first voltage sensing signal, wherein said first voltage sensing signal with said signal time length is said message carrying sensing signal to be delivered to said microcontroller.

5. The microcontroller based electronic switch according to claim 3, wherein said touchless interface of said first external control device is configured with a wireless remote control device for generating, detecting and converting a first wireless external control signal into said message carrying sensing signal with said signal format interpretable to said microcontroller.

6. The microcontroller based electronic switch according to claim 5, wherein said wireless remote control device is a Wi-Fi remote control device, a Blue Tooth remote control device, a Zig Bee remote control device or a radio frequency remote control device.

7. The microcontroller based electronic switch according to claim 5, wherein a second external control device is further installed and electrically coupled with said microcontroller for generating, detecting and converting a second external control signal into said message carrying sensing signal interpretable to said microcontroller, wherein said first external control device and said second external control device are designed to optionally deliver said message carrying sensing signal to said microcontroller to activate one of said illumination performance control modes including at least said on/off switch control mode, said dimming control mode, said illumination level switching control mode or said delay shutoff control mode according to said message carrying sensing signal.

8. The microcontroller based electronic switch according to claim 7, wherein said second external control device is configured with a direct touch interface for generating, detecting and converting said second external control signal into said message carrying sensing signal interpretable to said microcontroller.

9. The microcontroller based electronic switch according to claim 8, wherein said direct touch interface of said second external control device is configured with a push button or a touch sensor, wherein when a user contacts said direct touch interface for a time duration, said detection circuitry responsively generates a first voltage sensing signal with a signal time length corresponding to said time duration of said direct touch interface being contacted; when said user withdraws from said direct touch interface, said detection circuitry delivers a second voltage signal; said first voltage sensing signal with said signal time length is said message carrying sensing signal to be delivered to said microcontroller.

10. The microcontroller based electronic switch according to claim 8, wherein said direct touch interface of said second external control device is configured with a power interruption detection circuitry electrically coupled with said microcontroller to detect a short power interruption signal and convert said short power interruption signal into said message carrying sensing signal interpretable to said microcontroller; wherein said message carrying sensing signal is said short voltage signal.

11. The microcontroller based electronic switch according to claim 8, wherein said direct touch interface of said second external control device comprises a circuitry to detect a voltage level generated at a voltage divider and to convert said voltage level into said constant voltage signal with said voltage value interpretable to said microcontroller.

12. The microcontroller based electronic switch according to claim 7, wherein said second detection circuitry is configured with a touchless interface, wherein said touchless interface is configured with an active infrared ray sensor comprising an infrared ray transmitter for emitting infrared light into an area to form a defined detection zone, an infrared ray receiver for receiving infrared light reflected from an object in said defined detection zone, and a detection circuitry for detecting and generating different voltage signals in response to different motions of said object entering and leaving said defined detection zone; wherein when said object enters said defined detection zone, said detection circuitry operates to generate a first voltage sensing signal with said signal time length corresponding to a time duration of said object entering and staying in said defined detection zone; wherein when said object leaves said defined detection zone, said detection circuitry operates to generate a second voltage signal to conclude said signal time length of said first voltage sensing signal; wherein said first voltage sensing signal with said signal time length is said message carrying sensing signal to be delivered to said microcontroller.

13. The microcontroller based electronic switch according to claim 1, wherein said first external control device is configured with a direct touch interface for generating, detecting and converting said first external control signal into said message carrying sensing signal interpretable to said microcontroller.

14. The microcontroller based electronic switch according to claim 13, wherein said direct touch interface of said first external control device is configured with a push button or a touch sensor, wherein when a user contacts said direct touch interface for a time duration, said detection circuitry of said first external control device responsively generates a first voltage sensing signal with a signal time length corresponding to said time duration of said direct touch interface being contacted; wherein when said user withdraws from said direct touch interface, said detection circuitry delivers a second voltage signal; wherein said first voltage sensing signal with said signal time length is said message carrying sensing signal to be delivered to said microcontroller.

15. The microcontroller based electronic switch according to claim 13, wherein said direct touch interface of said first external control device is configured with a power interruption detection circuitry electrically coupled between a power switch and said microcontroller to generate, detect and convert a short power interruption signal into said message carrying sensing signal interpretable to said microcontroller; wherein said message carrying sensing signal is said short voltage signal.

16. The microcontroller based electronic switch according to claim 13, wherein said direct touch interface is a circuitry to detect a voltage level generated at a voltage divider and to convert said voltage level into said constant voltage signal with said voltage value interpretable to said microcontroller.

17. The microcontroller based electronic switch according to claim 1, wherein said illumination performance control mode is said on/off switch control mode, wherein said message carrying sensing signal is said short voltage signal, wherein when said microcontroller receives a first said message carrying sensing signal, said microcontroller operates to conduct said controllable switching circuitry to turn on said LED load, wherein when said microcontroller receives a second said message carrying sensing signal, said microcontroller operates to cutoff said controllable switching circuitry to turn off said LED load.

18. The microcontroller based electronic switch according to claim 1, wherein said illumination performance control mode is said on/off switch control mode, wherein said message carrying sensing signal is said short voltage signal, wherein when said microcontroller receives said message carrying sensing signal, said microcontroller operates to alternately perform between said conduction state and said cutoff state.

19. The microcontroller based electronic switch according to claim 1, wherein said illumination performance control mode is said dimming control mode, wherein said message carrying sensing signal is said long voltage signal, wherein upon detecting said long voltage signal, said microcontroller successively outputs control signals to increase or decrease said conduction rate of said controllable switching circuitry, wherein at a moment when said message carrying sensing signal ceases or said signal time length expires, a dimming end point is thereby selected for locking in a light intensity level at said dimming end point, wherein said light intensity level selected is memorized by said microcontroller for repetitive performance.

20. The microcontroller based electronic switch according to claim 1, wherein said illumination performance control mode is a free running dimming mode, wherein when said microcontroller receives a first said message carrying sensing signal, said microcontroller operates to activate a free running process to perform an automatic dimming work, wherein said microcontroller operates to successively change said conduction rate of said controllable switching circuitry from a maximum conduction rate to a minimum conduction rate, and continuously from said minimum conduction rate to said maximum conduction rate to perform at least one free running dimming cycle, wherein during said free running cycle when a second said message carrying sensing signal is received at a time point, said microcontroller operates to terminate said free running process with a light intensity level of said LED load being performed at said time point when said second message carrying sensing signal is generated to be a final selection of the light intensity, wherein said final selection of said light intensity is memorized by the microcontroller for repetitive performance.

21. The microcontroller based electronic switch according to claim 1, wherein said illumination performance control mode is said dimming control mode, wherein when said microcontroller receives said message carrying sensing signal being said long voltage signal, said microcontroller manages to output a control signal to adjust and set said conduction rate of said controllable switching circuitry according to said signal time length of said message carrying sensing signal received to perform a corresponding illumination with a selected light intensity.

22. The microcontroller based electronic switch according to claim 1, wherein said illumination performance control mode is said illumination level switching control mode, wherein said microcontroller is designed with an illumination level switching scheme comprising a plurality of different conduction rates of said controllable switching circuitry for controlling different power transmission levels from said power source to said LED load to correspondingly perform different illumination levels, wherein when said microcontroller receives said message carrying sensing signal, said microcontroller operates to perform a corresponding illumination level according to said signal format of said message carrying sensing signal.

23. The microcontroller based electronic switch according to claim 22, wherein said signal format of said message carrying sensing signal is said short voltage signal, wherein upon receiving said short voltage signal, said microcontroller operates to alternately perform each of said different illumination levels in said illumination level switching scheme according to a predetermined sequence.

24. The microcontroller based electronic switch according to claim 22, wherein said signal format of said message carrying sensing signal is said constant voltage signal with a voltage value interpretable to said microcontroller, wherein when said microcontroller receives said message carrying sensing signal with said signal format, said microcontroller operates to activate a process to select one of said plurality of different conduction rates of said controllable switching circuitry in said illumination level switching scheme according to said voltage value of said constant voltage signal for playing said corresponding illumination level.

25. The microcontroller based electronic switch according to claim 22, wherein said illumination level switching scheme is configured with at least two level illuminations including a first level illumination and a second level illumination; wherein said first level illumination is a high level illumination with said controllable switching circuitry being controlled at a high conduction rate to deliver a high level electric power to said LED load for generating said high level illumination and said second level illumination is a low level illumination with said controllable switching circuitry being controlled at a low conduction rate to deliver a low level electric power to said LED load for generating said low level illumination, wherein when said microcontroller receives said message carrying sensing signal, said microcontroller operates to alternately perform one of said at least two level illuminations.

26. The microcontroller based electronic switch according to claim 22, wherein said illumination level switching scheme is configured with at least three level illuminations including a first level illumination, a second level illumination and a third level illumination; wherein said first level illumination is a high level illumination with said controllable switching circuitry being controlled at a high conduction rate to deliver a high level electric power to said LED load for generating said high level illumination, wherein said second level illumination is a low level illumination with said controllable switching circuitry being controlled at a low conduction rate to deliver a low level electric power to said LED load for generating said low level illumination, wherein said third level illumination is a zero level illumination with said controllable switching circuitry being controlled at a zero conduction rate to turnoff said LED load, wherein when said microcontroller receives said message carrying sensing signal, said microcontroller operates to alternately perform one of said at least three level illuminations.

27. The microcontroller based electronic switch according to claim 22, wherein said illumination level switching scheme is configured with at least four level illuminations including a first level illumination, a second level illumination, a third level illumination and a fourth level illumination; wherein said first level illumination is a high level illumination with said controllable switching circuitry being controlled at a high conduction rate to deliver a high level electric power to said LED load for generating said high level illumination, wherein said second level illumination is a medium level illumination with said controllable switching circuitry being controlled at a medium conduction rate to deliver a medium level electric power to said LED load for generating said medium level illumination, wherein said third level illumination is a low level illumination with said controllable switching circuitry being controlled at a low conduction rate to deliver a low level electric power to said LED load to generate said low level illumination, and wherein said fourth level illumination is a zero level illumination with said controllable switching circuitry being controlled at a zero conduction rate to turnoff said LED load, wherein when said microcontroller receives said message carrying sensing signal, said microcontroller operates to alternately perform one of said at least four level illuminations.

28. The microcontroller based electronic switch according to claim 1, wherein said microcontroller based electronic switch is located and installed in an LED lamp.

29. The microcontroller based electronic switch according to claim 28, wherein said LED lamp is an LED bulb.

30. The microcontroller based electronic switch according to claim 1, wherein said preset time interval ranges from 1 second to 4 seconds.

31. A microcontroller based electronic switch, comprising:
- a controllable switching circuitry, electrically connected between an LED load and a power source;
- a first external control device, comprising at least a first detection circuitry for detecting and converting a first external control signal generated by operating said first external control device into a first message carrying sensing signal with a first signal format;
- a second external control device, comprising at least a second detection circuitry for detecting and converting a second external control signal generated by operating said second external control device into a second message carrying sensing signal with a second signal format; and
- a microcontroller, designed to interpret and execute said first message carrying sensing signal received from said first external control device or said second message carrying sensing signal received from said second external control device;
- wherein said first external control device, said second external control device and said controllable switching circuitry are respectively and electrically coupled with said microcontroller;
- wherein said first external control device is configured with a touchless interface for generating, detecting and converting said first external control signal into said first message carrying sensing signal interpretable to said microcontroller;
- wherein said second external control device is configured with a direct touch interface for generating, detecting and converting said second external control signal into said second message carrying sensing signal interpretable to said microcontroller;
- wherein said microcontroller outputs a first control signal to control a conduction state or a cutoff state of said controllable switching circuitry according to said first message carrying sensing signal, wherein said microcontroller outputs a second control signal to control said conduction state or said cutoff state of said controllable switching circuitry according to said second message carrying sensing signal, wherein said first external control device and said second external control device are designed to optionally control an illumination performance of said LED load, wherein said microcontroller operates to process said first message carrying sensing signal or said second message carrying sensing signal according to a time sequence of detection occurrence between said first external control device and said second external control device;
- wherein when said controllable switching circuitry is in said conduction state, said microcontroller further adjusts said first control signal to control a conduction rate of said controllable switching circuitry to set an electric power transmission level from said power source to said LED load to perform an illumination according to said first signal format of said first message carrying sensing signal, wherein said microcontroller adjusts said second control signal to control said conduction rate of said controllable switching circuitry to set an electric power transmission level from said power source to said LED load to perform an illumination according to said second signal format of said second message carrying sensing signal;
- wherein said first signal format of said first message carrying sensing signal or said second signal format of second message carrying sensing is a short voltage signal with a signal time length equal to or shorter than a preset time interval, a long voltage signal with a signal time length longer than said preset time interval, a constant voltage signal with a voltage value, a plurality of said short voltage signals, a plurality of said long voltage signals, or a combination of said short voltage signal(s) and said long voltage signal(s);
- wherein when said microcontroller receives said first message carrying sensing signal or said second message carrying sensing signal, said microcontroller manages to control said conduction rate of said controllable semiconductor switching device to perform one of illumination performance control modes including at least an on/off switch control mode, a dimming control mode, an illumination level switching control mode or a delay shutoff control mode according to said signal format of said message carrying sensing signal;
- wherein when said on/off control mode is performed, said first signal format or said second signal format is said short voltage signal, wherein said microcontroller operates to alternately perform between said conduction state and said cutoff state of said controllable switching circuitry according to said first message carrying sensing signal or said second message carrying sensing signal received;
- wherein when said dimming control mode is performed, said first signal format or said second signal format is said long voltage signal, wherein upon detecting said long voltage signal with said signal time length said microcontroller successively outputs said control signals to increase or decrease said conduction rate of said controllable switching circuitry, wherein at a moment when said signal time length of said long voltage signal expires, a dimming end point is thereby selected for locking in a light intensity level at said dimming end point, wherein said light intensity level selected is memorized by said microcontroller for repetitive performance;

wherein when said illumination level switching control mode is performed, said first signal format or said second signal format is said short voltage signal or said constant voltage signal interpretable to said microcontroller, wherein said microcontroller is designed with an illumination level switching scheme comprising a plurality of different said conduction rates of said controllable switching circuitry to deliver different power transmission levels from said power source to said LED load for generating different illumination levels characterized by different light intensities, wherein when said microcontroller receives said first message carrying sensing signal or said second message carrying sensing signal, said microcontroller operates to alternatively perform each of said different illumination levels according to a predetermined sequence activated by said short voltage signal or according to said voltage value of said constant voltage signal;

wherein when said delay shutoff control mode performed, said first signal format or said second signal format is said long voltage signal interpretable to said microcontroller, wherein upon detecting said long voltage signal with said signal time length said microcontroller operates to conduct said controllable switching circuitry to deliver said electric power transmission level to said LED load for a time duration equal to said signal time length, wherein upon an expiration of said signal time length, said controllable switching circuitry is cutoff to turn off said LED load to complete said delay shutoff control mode;

wherein said microcontroller is an integrated circuit programmable for generating the control signal or an application specific integrated circuit (ASIC) custom made for generating said control signal.

32. The microcontroller based electronic switch according to claim 31, wherein said touchless interface of said first external control device is an active infrared ray sensor comprising an infrared ray transmitter for emitting infrared light into an area to form a defined detection zone, an infrared ray receiver for receiving infrared light reflected from an object in said defined detection zone, for detecting and generating different voltage signals in response to different motions of said object entering and leaving said defined detection zone; wherein when said object enters said defined detection zone, said detection circuitry operates to generate a first voltage sensing signal with a signal time length corresponding to a time interval of said object entering and staying in said defined detection zone; wherein when said object leaves said defined detection zone, said detection circuitry operates to generate a second voltage signal to conclude said signal time length of said first voltage sensing signal, wherein said first voltage sensing signal with said signal time length is said first message carrying sensing signal to be delivered to said microcontroller.

33. The microcontroller based electronic switch according to claim 31, wherein said touchless interface of said first external control device is configured with a wireless remote control device comprising a remote wireless external control signal transmitter and a wireless external control signal receiver for generating, detecting and converting a wireless external control signal into said first message carrying sensing signal with said signal format interpretable to said microcontroller.

34. The microcontroller based electronic switch according to claim 33, wherein said wireless remote control device is a Wi-Fi remote control device, a Blue Tooth remote control device, a Zig Bee remote control device, or a radio frequency remote control device.

35. The microcontroller based electronic switch according to claim 31, wherein a wireless signal transmitter is further electrically coupled with said microcontroller to convert said first message carrying sensing signal or said second message carrying sensing signal into a wireless control signal to control a lighting performance of at least one remote lighting apparatus.

36. The microcontroller based electronic switch according to claim 35, wherein said wireless signal transmitter is a Wi-Fi signal transmitter, a Blue Tooth signal transmitter, a Zig Bee signal transmitter, or a radio frequency signal transmitter.

37. The microcontroller based electronic switch according to claim 31, wherein said direct touch interface of said second external control device is a push button or a touch sensor, wherein when a user contacts said direct touch interface for a time interval, said second detection circuitry responsively generates a first voltage signal with a signal time length corresponding to said time interval of said direct touch interface being contacted; wherein when said user withdraws from said direct touch interface, said second detection circuitry delivers a second voltage signal; wherein said first voltage sensing signal with said signal time length is said second message carrying sensing signal to be delivered to said microcontroller.

38. The microcontroller based electronic switch according to claim 31, wherein said direct touch interface of said second external control device comprises said second detection circuitry electrically coupled with said microcontroller to detect a voltage level generated at a voltage divider and convert said voltage level into said constant voltage signal interpretable to said microcontroller.

39. The microcontroller based electronic switch according to claim 31, wherein said direct touch interface of said second external control device is a power interruption detection circuitry electrically coupled between a power switch and said microcontroller to generate, detect and convert a short power interruption signal into said message carrying sensing signal interpretable to said microcontroller; wherein said message carrying sensing signal is said short voltage signal.

40. The microcontroller based electronic switch according to claim 31, wherein said microcontroller based electronic switch is located and installed in a wall electric outlet, wherein said controllable switching circuitry comprises a phase controller connected between said power source and said LED load, wherein said power source is an AC power, wherein said direct touch interface of said second external control device is a detection circuitry electrically coupled with said microcontroller to detect a voltage signal generated at a voltage divider and convert said voltage signal into said second message carrying sensing signal interpretable to said microcontroller, wherein upon receiving said second message carrying sensing signal said microcontroller outputs a pulse width modulation signal at each zero cross point in each half cycle of said AC power to control said conduction rate of said phase controller for adjusting and setting said illumination level of said LED load.

41. An LED lighting apparatus, comprising:
an LED load, configured with a plurality of LEDs;

a controllable switching circuitry, electrically connected between a power source and said LED load for delivering and controlling a DC power;
an external control device, comprising at least a detection circuitry for detecting an external control signal generated by operating said external control device and converting said external control signal into a message carrying sensing signal with a signal format; and
a microcontroller, designed to interpret and execute said message carrying sensing signal received from said external control device;
wherein said microcontroller is electrically coupled with said controllable switching circuitry and said external control device, wherein said microcontroller controls a conduction state or a cutoff state of said controllable switching circuitry according to said message carrying sensing signal;
wherein when said controllable switching circuitry is in said conduction state, said microcontroller further controls a conduction rate of said controllable switching circuitry for adjusting and setting an electric power transmission level from said power source to said LED load according to said message carrying sensing signal;
wherein said signal format of said message carrying sensing signal is a short voltage signal with a signal time length equal to or shorter than a preset time interval, a long voltage signal with a signal time length longer than said preset time interval, a constant voltage signal with a voltage value, a plurality of said short voltage signals, a plurality of said long voltage signals, or a combination of said short voltage signal(s) and said long voltage signal(s);
wherein said external control device is configured with a touchless interface, wherein when said microcontroller receives said message carrying sensing signal, said microcontroller operates to perform one of illumination performance control modes including at least an on/off switch control mode, a dimming control mode, an illumination level switching control mode or a delay shutoff control mode according to said signal format of said message carrying sensing signal;
wherein when said on/off control mode is performed, said signal format is said short voltage signal, wherein said microcontroller operates to alternately switch between performing said conduction state and performing said cutoff state of said controllable switching circuitry according to said message carrying sensing signal received;
wherein when said dimming control mode is performed, said signal format is said a long voltage signal, wherein upon detecting said long voltage signal said microcontroller successively outputs control signals to increase or decrease said conduction rate of said controllable switching circuitry to adjust said electric power delivered to said LED load;
wherein when said illumination level switching control mode is performed, said signal format is said short voltage signal or said constant voltage signal with said voltage value interpretable to said microcontroller, wherein said microcontroller is designed with an illumination level switching scheme comprising a plurality of different said conduction rates of said controllable switching circuitry for respectively performing different illumination levels, wherein when said microcontroller receives said message carrying sensing signal, said microcontroller operates to perform a corresponding illumination level in said illumination level switching scheme according to a prearranged sequence of said different illumination levels or according to said voltage value of said constant voltage signal interpreted by said microcontroller;
wherein when said delay shutoff control mode is performed, said signal format is said long voltage signal interpretable to said microcontroller, wherein upon detecting said long voltage signal with said signal time length said microcontroller operates to conduct said controllable switching circuitry to deliver said electric power transmission level to said LED load for a time duration equal to said signal time length, wherein upon an expiration of said signal time length, said controllable switching circuitry is cutoff to turn off said LED load to complete said delay shutoff control mode;
wherein said LED load in conjunction with a level setting of said DC power is designed with an adequate combination of said plurality of LEDs in series and/or in parallel connections such that an electric current passing through each LED of said LED load remains at an adequate level, and a voltage V across each LED complies with a constraint of $V_{th}<V<V_{max}$ featuring electrical characteristics of said LED;
wherein $V_{th}$ is a threshold voltage required to trigger said LED to start emitting light and $V_{max}$ is a maximum operating voltage across said LED to avoid a thermal damage to an LED construction; and
wherein said microcontroller is a programmable integrated circuit device or an application specific integrated circuit.

42. The LED lighting apparatus according to claim 41, wherein when said LED load is configured with LEDs or sets of in parallel connected LEDs electrically connected in series, a working voltage across said LED load is confined in a domain between a minimum voltage equal to a total sum of said threshold voltages of respective said LEDs or said sets of in parallel connected LEDs electrically connected in series and a maximum voltage equal to the total sum of said maximum operating voltages of respective said LEDs or said sets of in parallel connected LEDs electrically connected in series, namely $NxV_{th}<V_N<NxV_{max}$, wherein N is an integral representing the number of said LEDs or said sets of in parallel connected LEDs electrically connected in series and $V_N$ is said working voltage across said LED load.

43. The LED lighting apparatus according to claim 42, wherein when said LED load is configured with white LEDs, $V_{th}$=2.5 volts and $V_{max}$=3.5 volts, and accordingly $V_N$ is to be confined in a domain between Nx2.5 volts and Nx3.5 volts, namely $Nx2.5\ volts<V_N<Nx3.5\ volts$.

44. The LED lighting apparatus according to claim 41, wherein said touchless interface is configured with an active infrared ray sensor comprising an infrared ray transmitter for emitting infrared light into an area to form a defined detection zone, an infrared ray receiver for receiving infrared light reflected from an object in said defined detection zone and said detection circuitry for detecting and generating different voltage signals in response to different motions of said object entering and leaving said defined detection zone; wherein when said object enters said defined detection zone, said detection circuitry operates to generate a first voltage sensing signal with said signal time length corresponding to a time duration of said object entering and staying in said defined detection zone; wherein when said object leaves said defined detection zone, said detection circuitry operates to generate a second voltage signal to conclude said signal time length of said first voltage sensing signal, wherein said first voltage sensing signal with said signal time length is said message carrying sensing signal to be delivered to said microcontroller.

45. The LED lighting apparatus according to claim 41, wherein said touchless interface is configured with a wireless remote control device electrically coupled to said microcontroller for generating, detecting and converting a wireless external control signal into said message carrying sensing signal with said signal format interpretable to said microcontroller.

46. The LED lighting apparatus according to claim 45, wherein said wireless remote control device is a Wi-Fi remote control device, a Blue Tooth remote control device, a Zig Bee remote control device or a radio frequency remote control device.

47. The LED lighting apparatus according to claim 41, wherein when said microcontroller receives said message carrying sensing signal, said microcontroller checks said signal time length of said message carrying sensing signal, and operates at least two illumination performance control modes according to said signal time length of said message carrying sensing signal received;
wherein when said signal time length of said message carrying sensing signal is shorter than said preset time interval, said microcontroller operates said on/off switch control mode, wherein said microcontroller operates to control said controllable switching circuitry to perform alternately between said conduction state and said cutoff state;
wherein when said signal time length of said message carrying sensing signal is longer than said preset time interval, said microcontroller operates to perform said dimming control mode, wherein said microcontroller successively outputs control signals to continuously increase or decrease said conduction rate of said controllable switching circuitry according to said signal time length of said message carrying sensing signal, wherein at a moment at which said signal time length of said message carrying sensing signal expires or said message carrying sensing signal ceases, a dimming end point is concluded with said conduction rate of said controllable switching circuitry and a light intensity of said LED lighting apparatus being locked in at a level of said dimming end point.

48. The LED lighting apparatus according to claim 41, wherein said preset time interval ranges from 1 second to 4 seconds.

49. The LED lighting apparatus according to claim 41, wherein when said microcontroller receives said message carrying sensing signal, said microcontroller checks said signal time length of said message carrying sensing signal, and operates at least two illumination performance control modes according to said signal time length of said message carrying sensing signal received; wherein when said message carrying sensing signal is said short voltage signal, said microcontroller operates said on/off switch control mode, wherein said microcontroller controls said controllable switching circuitry to switch between performing said conduction state and said cutoff state alternately, wherein when said message carrying sensing signal is said long voltage signal, said microcontroller operates said dimming control mode to continuously output control signals to change said conduction rate of said controllable switching circuitry from a maximum conduction rate to a minimum conduction rate and then from said minimum conduction rate to said maximum conduction rate to complete a full dimming cycle, wherein at any moment during said full dimming cycle when said signal time length expires or said message carrying sensing signal ceases, a dimming end point is concluded with said conduction rate of said controllable switching circuitry and a light intensity of said LED lighting apparatus being locked in at a level of said dimming end point.

50. The LED lighting apparatus according to claim 41, wherein when said message carrying sensing signal is said short voltage signal or said constant voltage signal with said voltage value, said microcontroller manages to activate said illumination level switching scheme to alternately select one of said different conduction rates for performing a corresponding illumination level according to a prearranged sequence for each of said different illumination levels in said illumination level switching scheme or according to said voltage value of said constant voltage signal defined in said illumination switching scheme.

51. The LED lighting apparatus according to claim 41, wherein said controllable switching circuitry comprises at least a semiconductor switching device, wherein said switching circuitry is an LED driver delivering said DC power to the LED load.

52. An LED lighting apparatus, comprising:
an LED load, configured with a plurality of LEDs;
a controllable switching circuitry, electrically connected between a power source and said LED load for controlling and delivering a DC power;
an external control device, comprising at least a detection circuitry for detecting an external control signal generated by operating said external control device and converting said external control signal into a message carrying sensing signal with a signal format; and
a microcontroller, designed to interpret and execute said message carrying sensing signal received from said external control device;
wherein said microcontroller is electrically coupled with said controllable switching circuitry and said external control device, wherein said microcontroller outputs a control signal to control a conduction state or a cutoff state of said controllable switching circuitry according to said message carrying sensing signal received from said external control device;
wherein when said controllable switching circuitry is in said conduction state, said microcontroller further controls a conduction rate of said controllable switching circuitry for adjusting and setting an electric power transmission level from said power source to said LED load according to said message carrying sensing signal received from said external control device;
wherein said external control device is configured with a direct touch interface, wherein when said microcontroller receives said message carrying sensing signal, said microcontroller operates to perform one of illumination performance control modes including at least an on/off switch control mode, a dimming control mode, an illumination level switching control mode or a delay shutoff control mode according to said signal format of said message carrying sensing signal;
wherein when said on/off control mode is performed, said signal format is a short voltage signal with a signal time length shorter than a preset time interval, wherein said microcontroller manages to alternately perform between said conduction state and said cutoff state of said controllable switching circuitry according to said message carrying sensing signal received;
wherein when said dimming control mode is performed, said signal format is a long voltage signal with a signal time length longer than said preset time interval, wherein upon detecting said long voltage signal said microcontroller successively outputs said control signals to increase or decrease said conduction rate of said controllable switching circuitry, wherein at a moment when said message carrying sensing signal ceases or said signal time length of said long voltage signal expires, a dimming end point is thereby selected for locking in a light intensity level at said dimming end point, wherein said light intensity level selected is memorized by said microcontroller for repetitive performance;

wherein when said illumination level switching control mode is performed, said signal format is a short voltage signal or a constant voltage signal with a voltage value interpretable and executable to said microcontroller, wherein said microcontroller is designed with an illumination level switching scheme comprising a plurality of different said conduction rates of said controllable switching circuitry to respectively perform different illumination levels, wherein when said microcontroller receives said message carrying sensing signal, said microcontroller operates to alternately perform a corresponding illumination level in said illumination level switching scheme according to a prearranged sequence of said different illumination levels in said illumination level switching scheme or according to said voltage value of said constant signal defined in said illumination level switching scheme;

wherein said LED load in conjunction with a level setting of said DC power is designed with an adequate combination of said plurality of LEDs in series and/or in parallel connections such that an electric current passing through each LED of said LED load remains at an adequate level, and a voltage V across each LED complies with a constraint of $V_{th}<V<V_{max}$ featuring electrical characteristics of said LED;

wherein $V_{th}$ is a threshold voltage required to trigger said LED to start emitting light and $V_{max}$ is a maximum operating voltage across said LED to avoid a thermal damage to LED construction; and wherein said microcontroller is a programmable integrated circuit device or an application specific integrated circuit.

53. The LED lighting apparatus according to claim 52, wherein when said LED load is configured with LEDs or sets of in parallel connected LEDs electrically connected in series, a working voltage across said LED load is confined in a domain between a minimum voltage equal to the total sum of said threshold voltages of respective said LEDs or said sets of in parallel connected LEDs electrically connected in series and a maximum voltage equal to the total sum of said maximum operating voltages of respective said LEDs or said sets of in parallel connected LEDs electrically connected in series, namely $NxV_{th}<V_N<NxV_{max}$, wherein N is an integral representing the number of said LEDs or said sets of in parallel connected LEDs electrically connected in series and $V_N$ is said working voltage across said LED load.

54. The LED lighting apparatus according to claim 53, wherein when the LED load is configured with white LEDs, $V_{th}$=2.5 volts and V=3.5 volts, therefore VN is to be confined in a domain between N×2.5 volts and N×3.5 volts, namely N×2.5 volts<$V_N$<N×3.5 volts.

55. The LED lighting apparatus according to claim 52, wherein said direct touch interface of said external control device is configured with a push button or a touch sensor, wherein when a user contacts said direct touch interface for a time interval, said detection circuitry responsively generates a first voltage signal with a signal time length corresponding to said time interval of said direct touch interface being contacted; wherein when said user withdraws from said direct touch interface, said detection circuitry delivers a second voltage signal; wherein said first voltage sensing signal with said signal time length is said message carrying sensing signal to be delivered to said microcontroller.

56. The LED lighting apparatus according to claim 52, wherein said direct touch interface of said external control device comprises said detection circuitry electrically coupled with said microcontroller to detect a voltage level generated at a voltage divider and convert said voltage level into said constant voltage signal with said voltage value, wherein said message carrying sensing signal is said constant voltage signal interpretable and executable to said microcontroller to activate said illumination level switching scheme for performing said illumination level switching mode, wherein said plurality of different conduction rates of said controllable switching circuitry include at least a zero conduction rate and a full conduction rate.

57. The LED lighting apparatus according to claim 52, wherein said direct touch interface of said external control device is configured with a power interruption switch and a power interruption detection circuitry electrically coupled with said microcontroller to detect a short power interruption signal and convert said short power interruption signal into said message carrying sensing signal interpretable to said microcontroller; wherein said message carrying sensing signal is said short voltage signal;

wherein upon receiving said short voltage signal said microcontroller operates to activate said illumination level switching scheme to alternately perform each illumination level in said illumination level switching scheme according to said prearranged sequence of said illumination level switching scheme.

58. The LED lighting apparatus according to claim 52, wherein when said microcontroller receives said message carrying sensing signal, said microcontroller checks said signal time length of said message carrying sensing signal, and operates at least two illumination performance control modes according to said signal time length of said message carrying sensing signal; wherein when said signal time length of said message carrying sensing signal is shorter than said preset time interval, said microcontroller operates said on/off switch control mode, wherein said microcontroller controls said controllable switching circuitry to perform between said conduction state and said cutoff state alternately, wherein when said signal time length of said message carrying sensing signal is longer than said preset time interval, said microcontroller operates said dimming control mode, wherein said microcontroller successively outputs control signals to increase or to decrease said conduction rate of said controllable switching circuitry according to said signal time length of said message carrying sensing signal, wherein at a moment during said dimming control mode at which said signal time length of said message carrying sensing signal expires or said message carrying sensing signal ceases, a dimming end point is concluded with said conduction rate of said controllable switching circuitry and a light intensity of said LED lighting apparatus being locked in at a level of said dimming end point.

59. The LED lighting apparatus according to claim 52, wherein when said microcontroller receives said message carrying sensing signal, said microcontroller checks said signal time length of said message carrying sensing signal, and operates at least two illumination performance control modes according to said signal time length of said message carrying sensing signal; wherein when said signal time length of said message carrying sensing signal is shorter than said preset time interval, said microcontroller operates said on/off switch control mode, wherein said microcontroller controls said controllable switching circuitry to perform between said conduction state and said cutoff state alternately, wherein when said signal time length of said message carrying sensing signal is longer than said preset time interval, said microcontroller operates said dimming control mode to continuously output control signals to change said conduction rate of said controllable switching circuitry from a maximum conduction rate to a minimum conduction rate and then from said minimum conduction rate to said maximum conduction rate to complete a full dimming cycle, wherein at any moment during said full dimming cycle when said signal time length expires or said message carrying sensing signal ceases, a dimming end point is concluded with said conduction rate of said controllable switching circuitry and a light intensity of said LED lighting apparatus being locked in at a level of said dimming end point.

60. The LED lighting apparatus according to claim 52, wherein when said illumination level switching control mode is performed, said plurality of different conduction rates of said controllable switching circuitry in said illumination switching scheme include at least a zero conduction rate and a full conduction rate of said controllable switching circuitry.

61. The LED lighting apparatus according to claim 52, wherein said controllable switching circuitry comprises at least a semiconductor switching device, wherein said controllable switching circuitry is an LED driver delivering said DC power to the LED load.

62. The LED lighting apparatus according to claim 52, wherein said preset time interval ranges from 1 second to 4 seconds.

63. An LED lighting apparatus, comprising:
an LED load, configured with a plurality of LEDs;
a controllable switching circuitry, electrically connected between a power source and said LED load for controlling and delivering a DC power to said LED load; and
an external control device, comprising at least a detection circuitry for detecting an external control signal generated by operating said external control device and converting said external control signal into a message carrying sensing signal with a signal format;
wherein said controllable switching circuitry is an application specific integrated circuit designed to perform multi switching functions including a power supply management function, a power loading and control function and a controller function;
wherein said controllable switching circuitry is electrically coupled with said external control device, wherein said external control device controls a conduction state or a cutoff state of said controllable switching circuitry thru said message carrying sensing signal;
wherein when said controllable switching circuitry is in said conduction state, said external control device further controls a conduction rate of said controllable switching circuitry for adjusting and setting an electric power level delivered to said LED load thru said message carrying sensing signal;
wherein said signal format of said message carrying sensing signal is a short voltage signal with a signal time length equal to or shorter than a preset time interval, a long voltage signal with a signal time length longer than said preset time interval, a constant voltage signal with a voltage value, a plurality of said short voltage signals, a plurality of said long voltage signals, or a combination of said short voltage signal(s) and said long voltage signal(s);
wherein when said controllable switching circuitry receives said message carrying sensing signal, said controllable switching circuitry operates to perform one of illumination performance control modes including at least an on/off switch control mode, a dimming control mode, an illumination level switching control mode or a delay shutoff control mode according to said signal format of said message carrying sensing signal;
wherein when said on/off control mode is performed, said signal format is said short voltage signal, wherein said switching circuitry operates to alternately perform between said conduction state and said cutoff state according to said message carrying sensing signal received;
wherein when said dimming control mode is performed, said signal format is said long voltage signal, wherein upon detecting said long voltage signal said controllable switching circuitry operates to increase or decrease said conduction rate to adjust said electric power level delivered to said LED load;
wherein when said illumination level switching control mode is performed, said signal format is said short voltage signal or said constant voltage signal with said voltage value interpretable and executable to said controllable switching circuitry, wherein said controllable switching circuitry is designed with an illumination level switching scheme comprising a plurality of different conduction rates of said controllable switching circuitry respectively for performing different illumination levels, wherein when said controllable switching circuitry receives said message carrying sensing signal, said controllable switching circuitry operates to activate a process to alternately select a conduction rate in said illumination switching scheme to play a corresponding illumination level according to a prearranged sequence of said process or according to said voltage value of said constant signal defined in said process;
wherein when said delay shutoff control mode is performed, said signal format is said long voltage signal interpretable to said controllable switching circuitry, wherein upon receiving said long voltage signal with said signal time length said controllable switching circuitry operates to continue to deliver said electric power transmission level to said LED load for a time duration equal to said signal time length, wherein upon an expiration of said signal time length, said controllable switching circuitry is cutoff to turn off said LED load to complete said delay shutoff control mode;
wherein said LED load in conjunction with a level setting of said DC power is designed with an adequate combination of said plurality of LEDs in series and/or in parallel connections such that an electric current passing through each LED of said LED load remains at an adequate level, and a voltage V across each LED complies with a constraint of $V_{th}<V<V_{max}$ featuring electrical characteristics of said LED;
wherein $V_{th}$ is a threshold voltage required to trigger said LED to start emitting light and $V_{max}$ is a maximum operating voltage across said LED to avoid a thermal damage to LED construction.

64. The LED lighting apparatus according to claim 63, wherein when said LED load is configured with LEDs or sets of in parallel connected LEDs-electrically connected in series, a working voltage across said LED load is confined in a domain between a minimum voltage equal to the total sum of said threshold voltages of respective said LEDs or said sets of in parallel connected LEDs electrically connected in series and a maximum voltage equal to the total sum of said maximum operating voltages of respective said LEDs or said sets of in parallel connected LEDs electrically connected in series, namely $NxV_{th} < V_N < NxV_{max}$, wherein N is an integral representing the number of said LEDs or said sets of in parallel connected LEDs electrically connected in series and VN is said working voltage across said LED load.

65. The LED lighting apparatus according to claim 64, wherein when the LED load is configured with white LEDs, $V_{th}=2.5$ volts and $V_{max}=3.5$ volts, therefore $V_N$ is to be confined in a domain between Nx2.5 volts and Nx3.5 volts, namely $Nx2.5$ volts$<V_N<Nx3.5$ volts.

66. The LED lighting apparatus according to claim 63, wherein said controllable switching circuitry is a multifunctional LED driver capable of performing said power supply management function to control and deliver said DC power to said LED load, said power loading and control function to operate said LED load in said at least one of illumination performance control modes activated by said external control device, and said controller function to interpret and execute said message carrying sensing signal.

67. The LED lighting apparatus according to claim 63, wherein said external control device is configured with a push button or a touch sensor, wherein when a user contacts said external control device for a time interval, a detection circuitry responsively generates a first voltage signal with a signal time length corresponding to said time interval of said external control device being contacted; wherein when said user withdraws from said external control device, said detection circuitry delivers a second voltage signal; wherein said first voltage sensing signal with said signal time length is said message carrying sensing signal to be delivered to said controllable switching circuitry.

68. The LED lighting apparatus according to claim 63, wherein said external control device comprises said detection circuitry to detect a voltage level generated at a voltage divider and convert said voltage level into said constant voltage signal with said voltage value interpretable and executable to said controllable switching circuitry.

69. The LED lighting apparatus according to claim 63, wherein said external control device is configured with a power interruption detection circuitry designed to detect a short power interruption signal and convert said short power interruption signal into said message carrying sensing signal interpretable and executable to said controllable switching circuitry, wherein said message carrying sensing signal is said short voltage signal.

70. The LED lighting apparatus according to claim 63, wherein when said controllable switching circuitry receives said message carrying sensing signal, said controllable switching circuitry checks said signal time length of said message carrying sensing signal and operates at least two illumination performance control modes according to said signal time length of said message carrying sensing signal received; wherein when said signal time length of said message carrying sensing signal is shorter than said preset time interval, said controllable switching circuitry operates said on/off switch control mode, wherein said controllable switching circuitry operates to perform between said conduction state and said cutoff state alternately, wherein when said signal time length of said message carrying sensing signal is longer than said preset time interval, said controllable switching circuitry operates said dimming control mode, wherein said controllable switching circuitry operates to continuously increase or to continuously decrease said conduction rate according to said signal time length of said message carrying sensing signal, wherein at a moment during said dimming control mode at which said signal time length of said message carrying sensing signal expires or said message carrying sensing signal ceases, a dimming end point is concluded with said conduction rate of said controllable switching circuitry and a light intensity of said LED lighting apparatus being locked in at a level of said dimming end point.

71. The LED lighting apparatus according to claim 63, wherein when said controllable switching circuitry receives said message carrying sensing signal, said controllable switching circuitry checks said signal time length of said message carrying sensing signal, and operates at least two illumination performance control modes according to said signal time length of said message carrying sensing signal received; wherein when said signal time length of said message carrying sensing signal is shorter than said preset time interval, said controllable switching circuitry operates said on/off switch control mode, wherein said controllable switching circuitry operates to perform between said conduction state and said cutoff state alternately, wherein when said signal time length of said message carrying sensing signal is longer than said preset time interval, said controllable switching circuitry operates said dimming control mode to change said conduction rate of said controllable switching circuitry from a maximum conduction rate to a minimum conduction rate and then from said minimum conduction rate to said maximum conduction rate to complete a full dimming cycle, wherein at any moment during said full dimming cycle when said signal time length expires or said message carrying sensing signal ceases, a dimming end point is concluded with said conduction rate of said controllable switching circuitry and a light intensity of said LED lighting apparatus being locked in at a level of said dimming end point.

72. The LED lighting apparatus according to claim 63, wherein when said signal time length of said message carrying sensing signal is shorter than said preset time interval, said controllable switching circuitry operates to activate said illumination level switching control mode, wherein said controllable switching circuitry is designed with said illumination level switching scheme comprising a plurality of different conduction rates of said controllable switching circuitry designed respectively for performing different illumination levels, wherein when said controllable switching circuitry receives said message carrying sensing signal, said controllable switching circuitry operates to alternately select each of said different conduction rates for performing a corresponding illumination level according to said prearranged sequence.

73. The LED lighting apparatus according to claim 63, wherein said external control device is configured with an active infrared ray sensor comprising an infrared ray transmitter for emitting infrared light into an area to form a defined detection zone and an infrared ray receiver for receiving infrared light reflected from an object in said defined detection zone, wherein said infrared ray receiver is designed with said detection circuitry for detecting and generating different voltage signals in response to different motions of said object entering and leaving said defined detection zone; wherein when said object enters said defined detection zone, said detection circuitry operates to generate a first voltage sensing signal with a signal time length corresponding to a time duration of said object entering and staying in said defined detection zone; wherein when said object leaves said defined detection zone, said detection circuitry operates to generate a second voltage signal to conclude said signal time length of said first voltage sensing signal, wherein said first voltage sensing signal with said signal time length is said message carrying sensing signal to be delivered to said controllable switching circuitry.

74. The LED lighting apparatus according to claim 63, wherein said external control device is configured with a wireless remote control device including a wireless signal transmitter and a wireless signal receiver, wherein said wireless signal receiver is electrically coupled with said controllable switching circuitry to receive and convert a wireless external control signal generated by said wireless signal transmitter into said message carrying sensing signal with said signal format interpretable and executable to said controllable switching circuitry.

75. The LED lighting apparatus according to claim 74, wherein said wireless signal receiver is a Wi-Fi signal receiver, a Blue Tooth signal receiver, a Zig Bee signal receiver or a radio frequency signal receiver.

\* \* \* \* \*